United States Patent
Yoon

(10) Patent No.: US 12,167,670 B2
(45) Date of Patent: Dec. 10, 2024

(54) DISPLAY APPARATUS HAVING THICKNESS OF THE DISPLAY PANEL IN THE CONNECTION AREA LESS THAN THICKNESS IN THE PIXEL AREA

(71) Applicant: SAMSUNG DISPLAY CO., LTD., Yongin-si (KR)

(72) Inventor: Jangyeol Yoon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 473 days.

(21) Appl. No.: 17/545,078

(22) Filed: Dec. 8, 2021

(65) Prior Publication Data
US 2022/0209147 A1    Jun. 30, 2022

(30) Foreign Application Priority Data
Dec. 31, 2020    (KR) ........................ 10-2020-0189230

(51) Int. Cl.
*H10K 102/00* (2023.01)
*H10K 71/00* (2023.01)
*H10K 77/10* (2023.01)
*H10K 59/12* (2023.01)
*H10K 59/131* (2023.01)

(52) U.S. Cl.
CPC ........... *H10K 77/111* (2023.02); *H10K 71/00* (2023.02); *H10K 59/1201* (2023.02); *H10K 59/131* (2023.02); *H10K 2102/311* (2023.02)

(58) Field of Classification Search
CPC ............ H10K 59/1201; H10K 59/131; H10K 71/00; H10K 77/111; H10K 2102/311
USPC ...................................................... 257/59, 72
See application file for complete search history.

(56) References Cited

U.S. PATENT DOCUMENTS

| 2018/0219162 | A1 | 8/2018 | Tang |
| 2020/0266386 | A1 | 8/2020 | Jeon |
| 2021/0202675 | A1* | 7/2021 | Jang ..................... H10K 59/122 |

FOREIGN PATENT DOCUMENTS

| CN | 108269501 A | 7/2018 |
| KR | 1020170021431 A | 2/2017 |
| KR | 1020190071283 A | 6/2019 |
| KR | 1020190113563 A | 10/2019 |

* cited by examiner

*Primary Examiner* — Hoai V Pham
(74) *Attorney, Agent, or Firm* — CANTOR COLBURN LLP

(57) ABSTRACT

A display apparatus includes a display panel in which a through-opening is defined, where the display panel includes a first pixel area in which a first pixel is disposed, a second pixel area in which a second pixel is disposed, and a connection area extending from the first pixel area to the second pixel area, where an edge of the first pixel area, an edge of the connection area, and an edge of the second pixel area define at least a part of the through-opening passing through the display panel, and where a thickness of the display panel in the connection area is less than a thickness of the display panel in the first pixel area.

10 Claims, 42 Drawing Sheets

DISPLAY APPARATUS HAVING THICKNESS OF THE DISPLAY PANEL IN THE CONNECTION AREA LESS THAN THICKNESS IN THE PIXEL AREA

This application claims priority to Korean Patent Application No. 10-2020-0189230, filed on Dec. 31, 2020, and all the benefits accruing therefrom under 35 U.S.C. § 119, the content of which in its entirety is herein incorporated by reference.

BACKGROUND

1. Field

Embodiments relate to a display apparatus and a method of manufacturing the same.

2. Description of the Related Art

Mobility-based electronic devices are widely used. Recently, tablet personal computers, in addition to small electronic devices such as mobile phones, are widely used as mobile electronic devices.

A mobile electronic device includes a display apparatus to provide various functions, for example, visual information such as an image, to a user. As sizes of other components for driving a display apparatus are recently decreased, the proportion of the display apparatus in an electronic device gradually increases.

Recently, flexible display apparatuses that are bendable, foldable, or rollable are being studied and developed. Furthermore, stretchable display apparatuses that are changeable into various shapes are being actively studied and developed.

SUMMARY

Embodiments include a display apparatus having high flexibility and a method of manufacturing the same.

Additional features will be set forth in part in the description which follows and, in part, will be apparent from the description, or may be learned by practice of the presented embodiments.

In an embodiment of the invention, a display apparatus includes a display panel in which a through-opening is defined, where the display panel includes a first pixel area in which a first pixel is disposed, a second pixel area in which a second pixel is disposed, and a connection area extending from the first pixel area to the second pixel area, where an edge of the first pixel area, an edge of the connection area, and an edge of the second pixel area define at least a part of the through-opening passing through the display panel, and where a thickness of the display panel in the connection area is less than a thickness of the display panel in the first pixel area.

In an embodiment, the display panel may further include a substrate, and a display element disposed on the substrate and implementing the first pixel and the second pixel, where a thickness of the substrate overlapping the connection area is less than a thickness of the substrate overlapping the first pixel area.

The substrate may include a first base layer, a first barrier layer, and a second base layer which are sequentially stacked, where the first base layer and the second base layer overlap the first pixel area, and the first base layer does not overlap the connection area.

In an embodiment, at least one of the first base layer and the second base layer may include an inclined surface.

In an embodiment, the display panel may further include a substrate, an organic insulating layer disposed on the substrate, and a display element disposed on the organic insulating layer and implementing the first pixel and the second pixel, where the substrate overlaps the first pixel area and does not overlap the connection area, and the organic insulating layer extends from the first pixel area to the connection area.

In an embodiment, the display panel may further include a top surface of the display panel and a bottom surface of the display panel opposite to the top surface of the display panel, where a plurality of grooves is defined in the bottom surface of the display panel in the connection area.

In an embodiment, a width of the first pixel area may be greater than a width of the connection area.

In an embodiment, a plurality of concaves recessed toward an inner portion of the connection area may be defined in an edge of the connection area.

In an embodiment, a plurality of through-holes may be defined in the display panel in the connection area.

In an embodiment, the display apparatus may further include a pattern layer overlapping the connection area, where the pattern layer includes at least one of graphene oxide and polytetrafluoroethylene ("PTFE").

In an embodiment, a method of manufacturing a display apparatus includes forming, on a top surface of a support substrate including a first region, a second region, and a third region extending from the first region to the second region, a shield layer in which a first opening overlapping the first region and a second opening overlapping the second region are defined, forming a first base layer on the support substrate and the shield layer, forming a pattern layer on the first base layer to overlap the third region, and separating the first base layer overlapping the first region from the first base layer overlapping the third region.

In an embodiment, the pattern layer may include a body portion and a plurality of protrusions protruding from the body portion.

In an embodiment, the body portion may include a bottom surface of the body portion facing the first base layer and a top surface of the body portion opposite to the bottom surface of the body portion, and the plurality of protrusions may protrude from at least one of the bottom surface of the body portion and the top surface of the body portion.

In an embodiment, the first base layer may include a first base pattern overlapping the first region and a second base pattern overlapping the third region, and the pattern layer may extend from a top surface of the second base pattern to a portion between the first base pattern and the second base pattern.

In an embodiment, the method may further include forming a second base layer on the first base layer and the pattern layer.

In an embodiment, the method may further include removing at least a part of the second base layer to expose at least a part of the pattern layer.

In an embodiment, the method may further include detaching the second base layer overlapping the third region from the first base layer overlapping the third region.

In an embodiment, the method may further include detaching the pattern layer from any one of the first base layer and the second base layer.

In an embodiment, the method may further include irradiating a laser to a bottom surface of the support substrate opposite to the top surface of the support substrate, detaching the first base layer overlapping the first region from the support substrate, and remaining the first base layer overlapping the third region on the support substrate.

In an embodiment, the method may further include forming a pixel electrode on the first base layer to overlap at least one of the first region and the second region.

BRIEF DESCRIPTION OF THE DRAWINGS

The above and other features and advantages of certain embodiments will be more apparent from the following description taken in conjunction with the accompanying drawings, in which.

DETAILED DESCRIPTION

Figure 1:
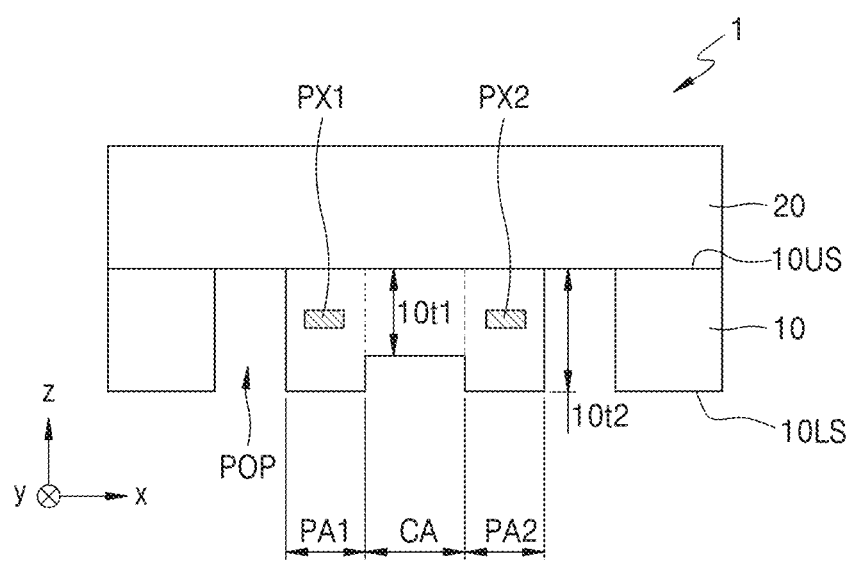
FIG. 1 is a cross-sectional view of an embodiment of a display apparatus.

Reference will now be made in detail to embodiments, examples of which are illustrated in the accompanying drawings, where like reference numerals refer to like elements throughout. In this regard, the embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the detailed description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described in detail with reference to the accompanying drawings, where the same or corresponding elements are denoted by the same reference numerals throughout and a repeated description thereof is omitted.

Although the terms "first," "second," etc. may be used to describe various elements, these elements should not be limited by these terms. These terms are only used to distinguish one element from another.

As used herein, the singular forms "a," "an," and "the" are intended to include the plural forms as well, unless the context clearly indicates otherwise.

It will be understood that the terms "including," "having," and "comprising" are intended to indicate the existence of the features or elements described in the specification, and are not intended to preclude the possibility that one or more other features or elements may exist or may be added.

It will be understood that when a layer, an area, or an element is referred to as being "on" another layer, area, or element, it may be directly on the other layer, area, or element, or intervening layers, areas, or elements may be present therebetween.

Sizes of elements in the drawings may be exaggerated or contracted for convenience of description. For example, because sizes and thicknesses of elements in the drawings are arbitrarily illustrated for convenience of description, the invention is not limited thereto.

When a certain embodiment may be implemented differently, a specific process order may be different from the described order. For example, two consecutively described processes may be performed substantially at the same time or performed in an order opposite to the described order.

It will be understood that when a layer, an area, or an element is referred to as being "connected" to another layer, area, or element, it may be "directly connected" to the other layer, area, or element or may be "indirectly connected" to the other layer, area, or element with other layers, areas, or elements interposed therebetween. For example, when a layer, an area, or an element is referred to as being "electrically connected," it may be directly electrically connected, and/or may be indirectly electrically connected with intervening layers, areas, or elements therebetween.

In an embodiment, a display apparatus for displaying a moving image or a still image may be used as a display screen of not only a portable electronic device such as a mobile phone, a smartphone, a tablet personal computer, a mobile communication terminal, an electronic organizer, an electronic book, a portable multimedia player ("PMP"), a navigation device, or an ultra-mobile personal computer ("UMPC") but also any of various products such as a television, a laptop computer, a monitor, an advertisement board, or an Internet of things ("IoT") product. Also, a display apparatus in an embodiment may be used in a wearable device such as a smart watch, a watch phone, a glasses-type display, or a head-mounted display ("HMD"). Also, a display apparatus in an embodiment may be used as a center information display ("CID") disposed on an instrument panel, a center fascia, or a dashboard of a vehicle, a room mirror display replacing a side-view mirror of a vehicle, or a display disposed on the back of a front seat for entertainment for a back seat of a vehicle.

Figure 2:
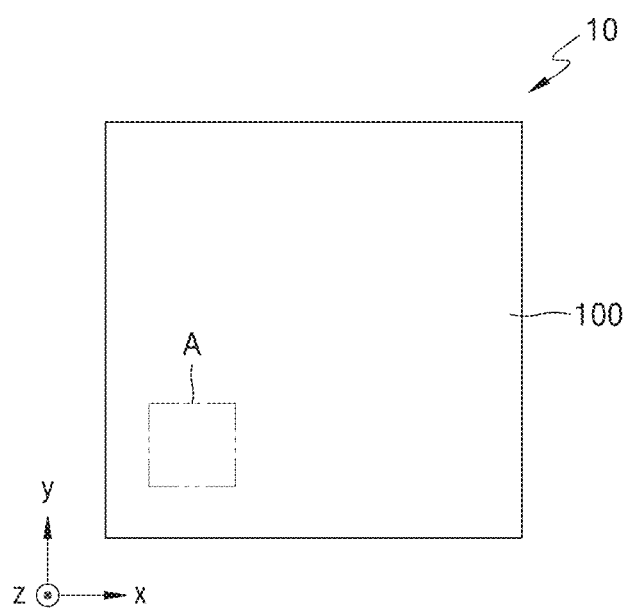
FIG. 2 is a plan view of an embodiment of a display panel.

FIG. 1 is a cross-sectional view of an embodiment of a display apparatus 1. FIG. 2 is a plan view of an embodiment of a display panel 10.

Referring to FIG. 1, the display apparatus 1 may include the display panel 10 and a cover window 20. The cover window 20 may be disposed on the display panel 10.

The display panel 10 may display an image. The display panel 10 may include a plurality of pixels, for example, a first pixel PX1 and a second pixel PX2. The display panel 10 may display an image by a plurality of pixels.

Each of the plurality of pixels may include a display element. The display panel 10 may be an organic light-emitting display panel using an organic light-emitting diode including an organic emission layer. In an alternative embodiment, the display panel 10 may be a light-emitting diode display panel using a light-emitting diode. The light-emitting diode may be a micro-scale or nano-scale size. In an embodiment, the light-emitting diode may be a micro-light-emitting diode, for example. In an alternative embodiment, the light-emitting diode may be a nanorod light-emitting diode. The nanorod light-emitting diode may include gallium nitride (GaN). In an embodiment, a color conversion layer may be disposed on the nanorod light-emitting diode. The color conversion layer may include quantum dots. In an alternative embodiment, the display panel 10 may be a quantum dot light-emitting display panel using a quantum dot light-emitting diode including a quantum dot emission layer. In an alternative embodiment, the display panel 10 may be an inorganic light-emitting display panel using an inorganic light-emitting device including an inorganic semiconductor. The following will be described in detail assuming that the display panel 10 is an organic light-emitting display panel using an organic light-emitting diode as a display element.

The display panel 10 may include a first pixel area PA1, a second pixel area PA2, and a connection area CA. The first pixel PX1 may be disposed in the first pixel area PA1. The second pixel PX2 may be disposed in the second pixel area PA2. The connection area CA may be disposed between the first pixel area PA1 and the second pixel area PA2. No pixel may be disposed in the connection area CA. The connection area CA may extend from the first pixel area PA1 to the second pixel area PA2.

In an embodiment, a first thickness 10t1 of the display panel 10 in the connection area CA may be less than a second thickness 10t2 of the display panel in the first pixel area PA1. The display panel 10 may include a bottom surface 10LS of the display panel 10 and a top surface 10US of the display panel 10 that is opposite to the bottom surface 10LS of the display panel 10. The bottom surface 10LS of the display panel 10 and the top surface 10US of the display panel 10 may be both ends in a thickness direction of the display panel 10. The first thickness 10t1 may be a distance between the top surface 10US of the display panel 10 and the bottom surface 10LS of the display panel 10 in the connection area CA. The second thickness 10t2 may be a distance between the top surface 10US of the display panel 10 and the bottom surface 10LS of the display panel 10 in the first pixel area PA1.

A through-opening POP may be defined in the display panel 10. The through-opening POP may pass through the display panel 10. In an embodiment, the through-opening POP may pass through the top surface 10US of the display panel 10 and the bottom surface 10LS of the display panel 10, for example. Accordingly, no element of the display panel 10 may be disposed in the through-opening POP. A plurality of through-openings POP may be defined in the display panel 10. Accordingly, the display panel 10 may be stretched and/or contracted.

When the display panel 10 is stretched and/or contracted, a shape of the connection area CA may be changed, and strain may occur in the connection area CA. Also, as a shape of the connection area CA is three-dimensionally changed, additional strain may occur. Accordingly, a maximum value of strain applied to the top surface 10US of the display panel 10 in the connection area CA and the bottom surface 10LS of the display panel in the connection area CA may increase.

In the illustrated embodiment, the first thickness 10t1 of the display panel 10 in the connection area CA may be less than the second thickness 10t2 of the display panel 10 in the first pixel area PA1. In this case, even when strain occurs in the connection area CA, a maximum value of strain occurring on the top surface 10US of the connection area CA and the bottom surface 10LS of the connection area CA may be reduced. Accordingly, the reliability of the stretched display panel 10 may be improved.

The cover window 20 may protect the display panel 10. In an embodiment, the cover window 20 may protect the display panel 10 by being easily bent according to an external force without cracks or the like. In an embodiment, the cover window 20 may be attached to the display panel 10 by a transparent adhesive member such as an optically clear adhesive ("OCA").

The cover window 20 may include glass, sapphire, or plastic. The cover window 20 may include, for example, ultra-thin glass ("UTG") or colorless polyimide ("CPI"). In an embodiment, the cover window 20 may have a structure in which a flexible polymer layer is disposed on a surface of a glass substrate, or may include only a polymer layer.

Referring to FIG. 2, the display panel 10 may include a substrate 100 and multiple layers disposed on the substrate 100. In an embodiment, a through-opening (not shown) may be defined in the display panel 10. The substrate 100 and the multiple layers may not be disposed in the through-opening. That is, the through-opening may be an empty portion of the display panel 10. A plurality of through-openings may be defined in the display panel 10. Because the plurality of through-openings is defined in the display panel 10, the flexibility of the display panel 10 may be improved.

In an embodiment, the substrate 100 may include glass or a polymer resin such as polyethersulfone, polyarylate, polyetherimide, polyethylene naphthalate, polyethylene terephthalate, polyphenylene sulfide, polyimide, polycarbonate, cellulose triacetate, or cellulose acetate propionate. The substrate 100 including the polymer resin may be flexible, rollable, or bendable. The substrate 100 may have a multi-layer structure including a base layer including the polymer resin and a barrier layer.

Figure 3:
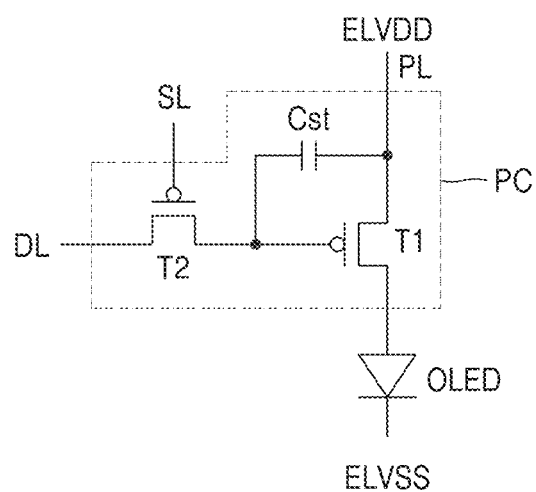
FIG. 3 is an equivalent circuit diagram illustrating a pixel circuit applicable to a display panel.

FIG. 3 is an equivalent circuit diagram illustrating a pixel circuit PC applicable to a display panel.

Referring to FIG. 3, the pixel circuit PC may be connected to a display element, for example, an organic light-emitting diode OLED.

The pixel circuit PC may include a driving thin-film transistor T1, a switching thin-film transistor T2, and a storage capacitor Cst. The organic light-emitting diode OLED may emit red light, green light, or blue light, or may emit red light, green light, blue light, or white light.

The switching thin-film transistor T2 may be connected to a scan line SL and a data line DL, and may transmit a data signal or a data voltage from the data line DL to the driving thin-film transistor T1 based on a scan signal or a switching voltage input from the scan line SL. The storage capacitor Cst may be connected to the switching thin-film transistor T2 and a driving voltage line PL, and may store a voltage corresponding to a difference between a voltage received from the switching thin-film transistor T2 and a first power supply voltage ELVDD supplied to the driving voltage line PL.

The driving thin-film transistor T1 may be connected to the driving voltage line PL and the storage capacitor Cst, and may control driving current flowing through the organic light-emitting diode OLED from the driving voltage line PL in response to a value of the voltage stored in the storage capacitor Cst. The organic light-emitting diode OLED may emit light having a predetermined luminance due to the driving current. A counter electrode of the organic light-emitting diode OLED may receive a second power supply voltage ELVSS. In an embodiment, a voltage level of the second power supply voltage ELVSS may be less than that of the first power supply voltage ELVDD. In an embodiment, the counter electrode of the organic light-emitting diode OLED may be connected to the ground and receives 0 volt (V).

Although the pixel circuit PC includes two thin-film transistors and one storage capacitor in FIG. 3, the pixel circuit PC may include three, four, five, or more thin-film transistors.

Figure 4A:
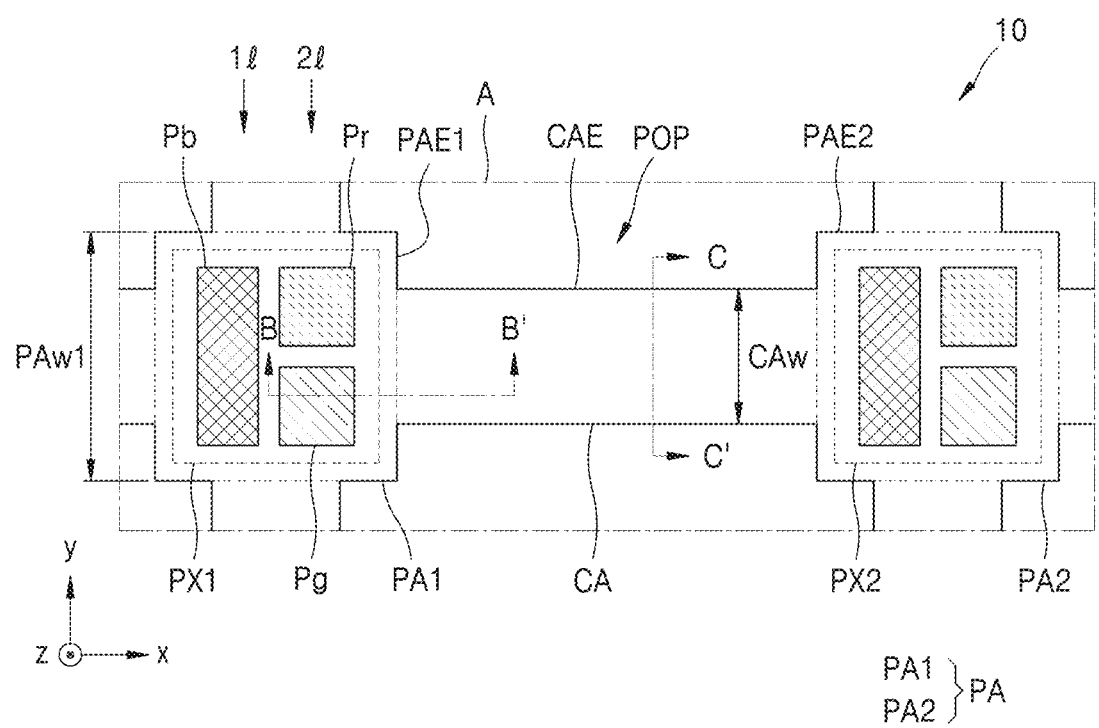
FIGS. 4A through 4C are plan views illustrating embodiments of a part of a display panel.
Figure 4B:
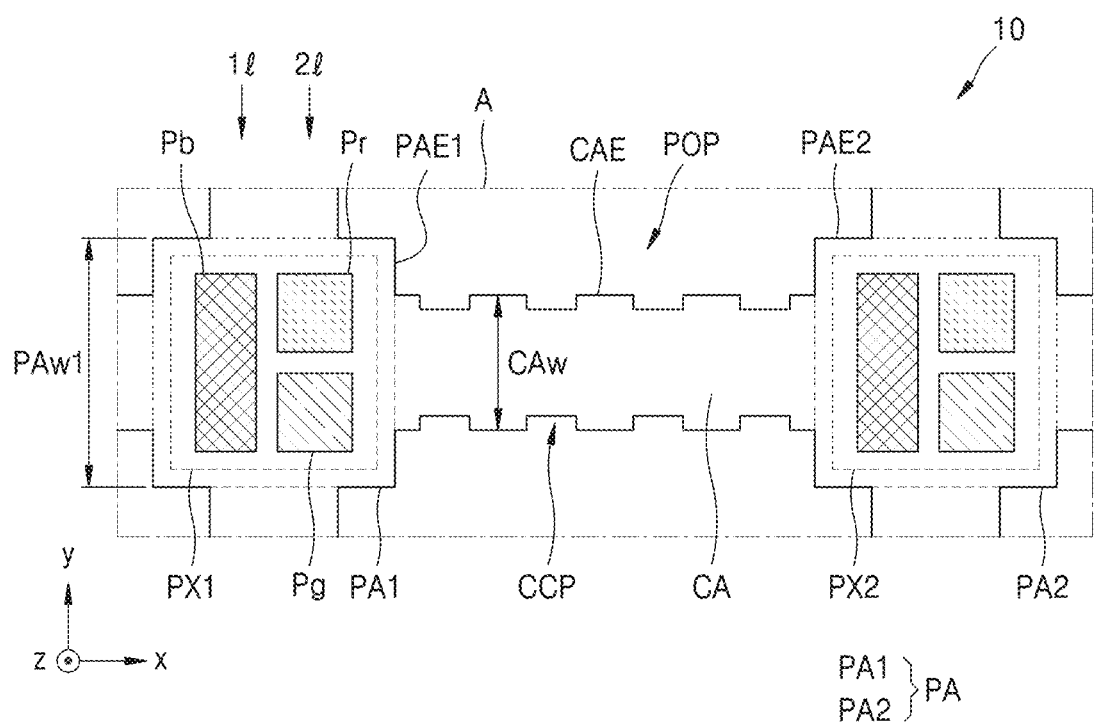
Figure 4C:
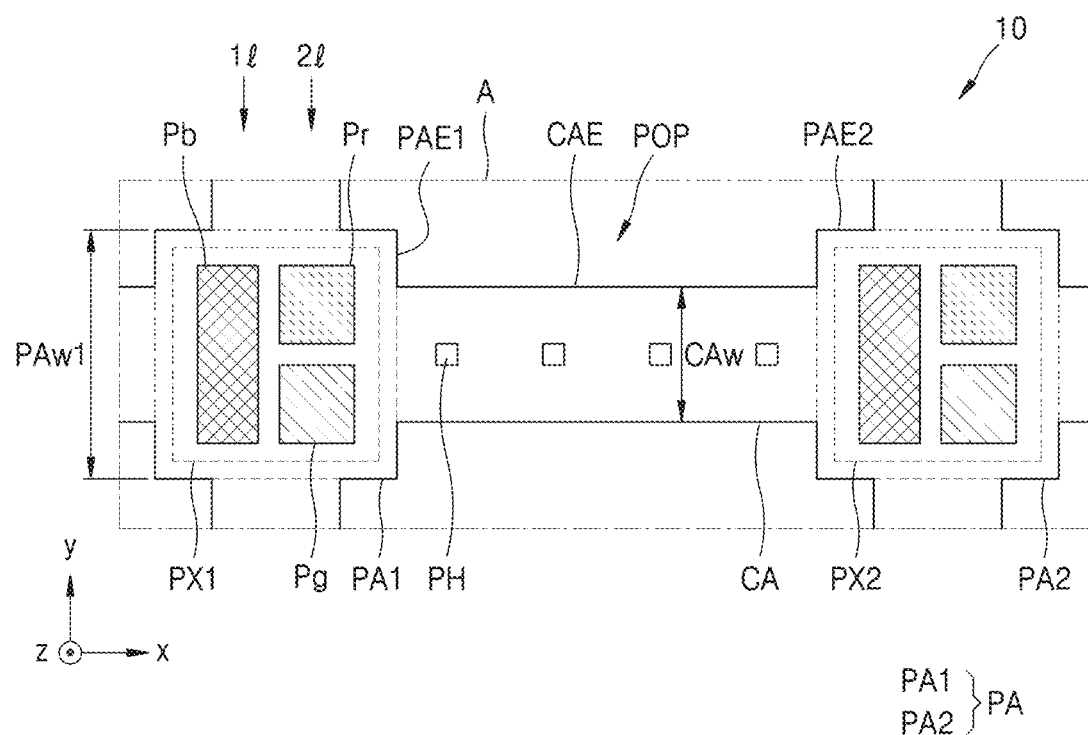

FIGS. 4A through 4C are plan views illustrating embodiments of a part of the display panel 10. FIGS. 4A through 4C are enlarged views illustrating a portion A of FIG. 2.

Referring to FIGS. 4A through 4C, the display panel 10 may include a pixel area PA and the connection area CA. The pixel area PA may include the first pixel area PA1 and the second pixel area PA2. In an embodiment, the display panel 10 may include a plurality of first pixel areas PA1 and a plurality of second pixel areas PA2. Also, the display panel 10 may include a plurality of connection areas CA.

The first pixel PX1 may be disposed in the first pixel area PA1. The first pixel area PA1 may be spaced apart from the second pixel area PA2. The first pixel area PA1 may be adjacent to the connection area CA. In an embodiment, the first pixel area PA1 may be adjacent to at least one connection area CA. In an embodiment, the first pixel area PA1 may be adjacent to one connection area CA, for example. In an alternative embodiment, the first pixel area PA1 may be adjacent to a plurality of connection areas CA.

The second pixel PX2 may be disposed in the second pixel area PA2. The second pixel area PA2 may be spaced apart from the first pixel area PA1. The second pixel area PA2 may be adjacent to the connection area CA. In an embodiment, the second pixel area PA2 may be adjacent to at least one connection area CA. In an embodiment, the second pixel area PA2 may be adjacent to one connection area CA. In an alternative embodiment, the second pixel area PA2 may be adjacent to a plurality of connection areas CA, for example. The second pixel area PA2 may be similar to the first pixel area PA1.

The connection area CA may extend from the first pixel area PA1 to the second pixel area PA2. The first pixel area PA1 and the second pixel area PA2 may extend to each other by the connection area CA. In an embodiment, when the display panel 10 includes a plurality of connection areas CA, the plurality of connection areas CA may be adjacent to the first pixel area PA1 and/or the second pixel area PA2. In an alternative embodiment, the plurality of connection areas CA may extend from the first pixel area PA1 and/or the second pixel area PA2.

One of the plurality of connection areas CA may extend in a first direction. Another one of the plurality of connection areas CA may extend in a second direction intersecting the first direction. In an embodiment, the first direction and the second direction may be perpendicular to each other. In an embodiment, the first direction may be an x direction or a −x direction of FIGS. 4A through 4C, and the second direction may be a y direction or a −y direction of FIGS. 4A through 4C, for example. In another embodiment, an acute angle or an obtuse angle may be defined between the first direction and the second direction. The following will be described in detail assuming that the first direction (e.g., the x direction or the −x direction) and the second direction (e.g., the y direction or the −y direction) are perpendicular to each other to define a right angle therebetween.

In an embodiment, the first pixel area PA1 and the connection area CA may be defined as one basic unit. In this case, the basic units may be repeatedly arranged in the first direction (e.g., the x direction or the −x direction) and/or the second direction (e.g., the y direction or the −y direction), and the display panel 10 may be provided by connecting the repeatedly arranged basic units.

The through-opening POP may be defined in the display panel 10. The through-opening POP may pass through the display panel 10. Accordingly, no element of the display panel 10 may be disposed in the through-opening POP. The display panel 10 may include a plurality of through-openings POP. Accordingly, the flexibility of the display panel 10 may be improved.

At least a part of the through-opening POP may be defined by an edge PAE1 of the first pixel area PA1, an edge PAE2 of the second pixel area PA2, and an edge CAE of the connection area CA. In an embodiment, the through-opening POP may have a closed loop shape in a plan view. In another embodiment, the through-opening POP may be partially enclosed in a plan view.

A width PAw1 of the first pixel area PA1 may be greater than a width CAw of the connection area CA. A width of the second pixel area PA2 may be greater than the width CAw of the connection area CA. The width PAw1 of the first pixel area PA1 may be a distance between the edges PAE1 of the first pixel area PA1 facing each other in a direction perpendicular to an extending direction of the connection area CA. In an embodiment, when the connection area CA extends in the first direction (e.g., the x direction or the −x direction), the width PAw1 of the first pixel area PA1 may be a distance between the edges PAE1 of the first pixel area PA1 facing each other in the second direction (e.g., the y direction or the −y direction), for example. The width CAw of the connection area CA may be a distance between the edges CAE of the connection area CA facing each other in a direction perpendicular to the extending direction of the connection area CA. In an embodiment, when the connection area CA extends in the first direction (e.g., the x direction or the −x direction), the width CAw of the connection area CA may be a distance between the edges CAE of the connection area CA facing each other in the second direction (e.g., the y direction or the −y direction), for example.

In the illustrated embodiment, the width PAw1 of the first pixel area PA1 may be greater than the width CAw of the connection area CA. Accordingly, the connection area CA may have a high elongation, and may be more deformed than the first pixel area PA1.

Also, a thickness of the first pixel area PA1 and a thickness of the second pixel area PA2 may be greater than a thickness of the connection area CA. Accordingly, even when strain occurs in the connection area CA, a maximum value of strain occurring in the connection area CA may be reduced.

Each of the first pixel PX1 and the second pixel PX2 may include a red sub-pixel Pr, a green sub-pixel Pg, and a blue sub-pixel Pb. The red sub-pixel Pr, the green sub-pixel Pg, and the blue sub-pixel Pb may respectively emit red light, green light, and blue light. In another embodiment, each of the first pixel PX1 and the second pixel PX2 may include a red sub-pixel Pr, a green sub-pixel Pg, a blue sub-pixel Pb, and a white sub-pixel. The red sub-pixel Pr, the green sub-pixel Pg, the blue sub-pixel Pb, and the white sub-pixel may respectively emit red light, green light, blue light, and white light. The following will be described in detail assuming that each of the first pixel PX1 and the second pixel PX2 includes the red sub-pixel Pr, the green sub-pixel Pg, and the blue sub-pixel Pb.

In an embodiment, a sub-pixel arrangement structure of the first pixel PX1 and a sub-pixel arrangement structure of the second pixel PX2 may be S-stripe structures. In an embodiment, in a first column 11, the blue sub-pixel Pb may be disposed, and in a second column 21 adjacent to the first column 11, the red sub-pixel Pr and the green sub-pixel Pg may be disposed, for example. In this case, the blue sub-pixel Pb may be provided in a quadrangular shape having a long side in the second direction (e.g., the y direction or the −y direction), and the red sub-pixel Pr and the green sub-pixel Pg may each be provided in a quadrangular shape. In other words, a side of the red sub-pixel Pr and a side of the green sub-pixel Pg may face a long side of the blue sub-pixel Pb.

In another embodiment, a sub-pixel arrangement structure of the first pixel PX1 and a sub-pixel arrangement structure of the second pixel PX2 may be stripe structures. In an embodiment, the red sub-pixel Pr, the green sub-pixel Pg, and the blue sub-pixel Pb may be arranged parallel to one another in the first direction (e.g., the x direction or the −x direction) or the second direction (e.g., the y direction or the −y direction), for example. In another embodiment, a sub-pixel arrangement structure of the first pixel PX1 and a sub-pixel arrangement structure of the second pixel PX2 may be pentile structures.

Referring to FIGS. 4A and 4C, the edge CAE of the connection area CA may extend in the extending direction of the connection area CA. In an embodiment, when the connection area CA extends in the first direction (e.g., the x direction or the −x direction), the edge CAE of the connection area CA may extend in the first direction (e.g., the x direction or the −x direction), for example.

Referring to FIG. 4B, a plurality of concaves CCP recessed toward an inner portion of the connection area CA may be defined in the edge CAE of the connection area CA. In other words, the concave CCP may be the edge CAE of the connection area CA that is substantially recessed toward an inner portion of the connection area CA. An inner direction of the connection area CA may be a direction from the edge CAE to the inside of the connection area CA. In an embodiment, the edge CAE of the connection area CA may be recessed in the second direction (e.g., the y direction or the −y direction), for example. In some embodiments, the edge CAE of the connection area CA may have a stepped portion.

Although a plurality of concaves CCP has the same shape in FIG. 4B, in another embodiment, a shape of one of the plurality of concaves CCP may be different from that of another one of the plurality of concaves CCP. Although the plurality of concaves CCP has quadrangular shapes in FIG. 4B, in another embodiment, the plurality of concaves CCP may have other polygonal shapes such as triangular or pentagonal shapes. In another embodiment, the plurality of concaves CCP may be provided in curved shapes.

Because the display panel 10 has flexibility, the display panel 10 may be manufactured on a relatively rigid support substrate (not shown). Next, the display panel 10 may be detached from the support substrate. In this case, in order to detach the display panel 10 from the support substrate, a pattern layer having low binding energy and/or bond strength with any one of elements of the display panel 10 may be disposed on the support substrate, and the display panel 10 may be provided. Because the plurality of concaves CCP is provided in the edge CAE of the connection area CA, an area occupied by the pattern layer may be greater than an area occupied by the connection area CA. Accordingly, the display panel 10 may be easily detached from the pattern layer.

Referring to FIG. 4C, a plurality of through-holes PH may be defined in the display panel 10 in the connection area CA. The plurality of through-holes PH may pass through the display panel 10. The plurality of through-holes PH may be spaced apart from the through-opening POP.

Although the plurality of through-holes PH has quadrangular shapes in FIG. 4C, in another embodiment, the plurality of through-holes PH may have other polygonal shapes such as triangular shapes or pentagonal shapes. In another embodiment, the plurality of through-holes PH may have circular shapes.

Although the plurality of through-holes PH is arranged along one line in FIG. 4C, in another embodiment, the plurality of through-holes PH may be arranged along a plurality of lines. Also, although the plurality of through-holes PH is aligned in the first direction (e.g., the x direction or the −x direction) in FIG. 4C, in another embodiment, the plurality of through-holes PH may be arranged in any of various ways in the connection area CA.

Because the display panel 10 has flexibility, the display panel 10 may be manufactured on a relatively rigid support substrate (not shown). Next, the display panel 10 may be detached from the support substrate. In this case, in order to detach the display panel 10 from the support substrate, a pattern layer having low binding energy and/or bond strength with any one of elements of the display panel 10 may be disposed on the support substrate, and the display panel 10 may be provided. Because the plurality of through-holes PH is defined inside the connection area CA, an area occupied by the pattern layer may be greater than an area occupied by the connection area CA. Accordingly, the display panel 10 may be easily detached from the pattern layer.

The following will be described in detail assuming that the edge CAE of the connection area CA extends in the extending direction of the connection area CA as shown in FIG. 4A.

FIGS. 5A through 5G are cross-sectional views of embodiments of the display panel 10. FIGS. 5A through 5G are cross-sectional views taken along line B-B' of the display panel 10 of FIG. 4A.

Referring to FIGS. 5A through 5G, the display panel 10 may include the first pixel area PA1 and the connection area CA. The connection area CA may extend from the first pixel area PA1.

In an embodiment, the first thickness 10t1 of the display panel 10 in the connection area CA may be less than the second thickness 10t2 of the display panel 10 in the first pixel area PA1. The display panel 10 may include the bottom surface 10LS of the display panel 10 and the top surface 10US of the display panel 10 that is opposite to the bottom surface 10LS of the display panel 10. The bottom surface 10LS of the display panel 10 and the top surface 10US of the display panel 10 may be both ends in a thickness direction of the display panel 10. In an embodiment, the bottom surface 10LS of the display panel 10 and the top surface 10US of the display panel 10 may be both ends in a third direction (e.g., a z direction or a −z direction), for example. The first thickness 10t1 may be a distance between the top surface 10US of the display panel 10 and the bottom surface 10LS of the display panel 10 in the connection area CA. The second thickness 10t2 may be a distance between the top surface 10US of the display panel 10 and the bottom surface 10LS of the display panel 10 in the first pixel area PA1. In this case, even when strain occurs in the connection area CA, a maximum value of strain occurring on the top surface 10US of the connection area CA and the bottom surface 10LS of the connection area CA may be reduced. Accordingly, the reliability of the stretched display panel 10 may be improved.

A stacked structure of the display panel 10 will now be described in detail. Also, a stacked structure of the display panel 10 in the first pixel area PA1 will be first described, and then a stacked structure of the display panel 10 in the connection area CA will be described.

The display panel 10 may include the substrate 100, a buffer layer 111, an inorganic insulating layer IIL, the pixel circuit PC, an inorganic protective layer PVX, a connection electrode CM, a wiring WL, a lower organic insulating layer 115, a first organic insulating layer 116, a second organic insulating layer 117, and an organic light-emitting diode OLED.

The substrate 100 may include a base layer and a barrier layer on the base layer. In an embodiment, the substrate 100 may include a first base layer 100a, a first barrier layer 100b, a second base layer 100c, and a second barrier layer 100d that are sequentially stacked.

In an embodiment, at least one of the first base layer 100a and the second base layer 100c may include a polymer resin such as polyethersulfone, polyarylate, polyetherimide, polyethylene naphthalate, polyethylene terephthalate, polyphenylene sulfide, polyimide, polycarbonate, cellulose triacetate, or cellulose acetate propionate.

Each of the first barrier layer 100b and the second barrier layer 100d may be a barrier layer that prevents penetration of an external foreign material. Each of the first barrier layer 100b and the second barrier layer 100d may prevent and reduce damage to the first pixel area PA1. In an embodiment, each of the first barrier layer 100b and the second barrier layer 100d may have a single or multi-layer structure including an inorganic material such as silicon nitride ($SiN_x$), silicon oxide ($SiO_2$), and/or silicon oxynitride (SiON).

The buffer layer 111 may be disposed on the substrate 100. The buffer layer 111 may be disposed in the first pixel area PA1. In an embodiment, the buffer layer 111 may include an inorganic insulating material such as silicon nitride ($SiN_x$), silicon oxynitride (SiON), or silicon oxide ($SiO_2$), and may have a single or multi-layer structure including the above inorganic insulating material. In an embodiment, the buffer layer 111 may be omitted.

The pixel circuit PC may include a thin-film transistor TFT and a storage capacitor Cst. The thin-film transistor TFT may include a semiconductor layer Act, a gate electrode GE, a source electrode SE, and a drain electrode DE. The storage capacitor Cst may include a lower electrode CE1 and an upper electrode CE2.

The semiconductor layer Act may be disposed on the buffer layer 111. The semiconductor layer Act may include polysilicon. In an alternative embodiment, the semiconductor layer Act may include amorphous silicon, an oxide semiconductor, or an organic semiconductor. The semiconductor layer Act may include a channel region, and a drain region and a source region respectively disposed on both sides of the channel region.

The gate electrode GE may overlap the channel region. The gate electrode GE may include a low-resistance metal material. The gate electrode GE may include a conductive material including molybdenum (Mo), aluminum (Al), copper (Cu), or titanium (Ti), and may have a single or multi-layer structure including the above material.

The inorganic insulating layer IIL may include a first gate insulating layer 112, a second gate insulating layer 113, and an inter-insulating layer 114. The second barrier layer 100d, the buffer layer 111, and the inorganic insulating layer IIL may include end portions EG at an edge of the first pixel area PA1. That is, the second barrier layer 100d, the buffer layer 111, and the inorganic insulating layer IIL may be disposed in the first pixel area PA1, and may not be disposed in the connection area CA. In other words, openings overlapping the connection area CA may be defined in the second barrier layer 100d, the buffer layer 111, and the inorganic insulating layer IL. Although the end portion of the second barrier layer 100d, the end portion of the buffer layer 111, and the end portion of the inorganic insulating layer IIL are matched in FIGS. 5A through 5G, in another embodiment, the end portion of the second barrier layer 100d, the end portion of the buffer layer 111, and the end portion of the inorganic insulating layer IIL may not be matched. That is, the end portion of the second barrier layer 100d, the end portion of the buffer layer 111, and the end portion of the inorganic insulating layer IIL may have a stepped portion.

In an embodiment, the first gate insulating layer 112 between the semiconductor layer Act and the gate electrode GE may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$), and zinc oxide ($ZnO_x$) may be ZnO and/or $ZnO_2$.

The second gate insulating layer 113 may cover the gate electrode GE. In an embodiment, the second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$), like the first gate insulating layer 112. Zinc oxide ($ZnO_x$) may be ZnO and/or $ZnO_2$.

The upper electrode CE2 may be disposed over the second gate insulating layer 113. The upper electrode CE2 may overlap the gate electrode GE disposed under the upper electrode CE2. In this case, the gate electrode GE of the thin-film transistor TFT and the upper electrode CE2 overlapping each other with the second gate insulating layer 113 may constitute the storage capacitor Cst. That is, the gate electrode GE of the thin-film transistor TFT may function as the lower electrode CE1 of the storage capacitor Cst.

As such, the storage capacitor Cst and the thin-film transistor TFT may overlap each other. In some embodiments, the storage capacitor Cst may not overlap the thin-film transistor TFT.

In an embodiment, the upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single or multi-layer structure including the above material.

The inter-insulating layer 114 may cover the upper electrode CE2. In an embodiment, the inter-insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$), and zinc oxide ($ZnO_x$) may be ZnO and/or $ZnO_2$. The inter-insulating layer 114 may have a single or multi-layer structure including the above inorganic insulating material.

Each of the drain electrode DE and the source electrode SE may be disposed on the inter-insulating layer 114. Each of the drain electrode DE and the source electrode SE may include a material having high conductivity. In an embodiment, each of the drain electrode DE and the source electrode SE may include a conductive material including molybdenum (Mo), aluminum (Al), copper (Cu), or titanium (Ti), and may have a single or multi-layer structure including the above material. In an embodiment, each of the drain electrode DE and the source electrode SE may have a multi-layer structure including Ti/Al/Ti.

The wiring WL may be disposed on the inter-insulating layer 114. In some embodiments, the wiring WL may transmit a power supply voltage. In another embodiment, the wiring WL may transmit a data signal or a data voltage. In another embodiment, the wiring WL may transmit a scan signal or a scan voltage.

In an embodiment, the wiring WL may include a material having high conductivity, the wiring WL may include a conductive material including molybdenum (Mo), aluminum (Al), copper (Cu), or titanium (Ti), and may have a single or multi-layer structure including the above material. In an embodiment, the wiring WL may have a multi-layer structure including Ti/Al/Ti.

The inorganic protective layer PVX may be disposed over the thin-film transistor TFT and the wiring WL. The inorganic protective layer PVX may cover and protect the source electrode SE, the drain electrode DE, and the wiring WL. In an embodiment, a portion of the wiring WL may be exposed through an inorganic contact hole ICH. The exposed portion of the wiring WL may be damaged by an etchant used during patterning of the pixel electrode 211. Because the inorganic protective layer PVX covers at least a part of the wiring WL in the illustrated embodiment, damage to the wiring WL during a patterning process of the pixel electrode 211 may be prevented or reduced. In an embodiment, the inorganic protective layer PVX may have a single or multi-layer structure including an inorganic material such as silicon nitride ($SiN_x$) and/or silicon oxide ($SiO_2$).

The first organic insulating layer 116 may cover the inorganic protective layer PVX. In an embodiment, the first organic insulating layer 116 may include an organic insulating material such as a general-purpose polymer (e.g., polymethyl methacrylate ("PMMA") or polystyrene ("PS")), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a combination thereof.

The connection electrode CM may be disposed on the first organic insulating layer 116. In this case, the connection electrode CM may be connected to the drain electrode DE or the source electrode SE through a contact hole of the first organic insulating layer 116. The connection electrode CM may include a material having high conductivity. In an embodiment, the connection electrode CM may include a conductive material including molybdenum (Mo), aluminum (Al), copper (Cu), or titanium (Ti), and may have a single or multi-layer structure including the above material. In an embodiment, the connection electrode CM may have a multi-layer structure including Ti/Al/Ti. In some embodiments, an upper wiring (not shown) may be disposed on the first organic insulating layer 116. In an embodiment, the upper wiring may include the same material as that of the connection electrode CM.

The second organic insulating layer 117 may cover the connection electrode CM. In an embodiment, the second organic insulating layer 117 may include an organic insulating material such as a general-purpose polymer (e.g., PMMA or PS), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a combination thereof. In some embodiments, a third organic insulating layer (not shown) may be further disposed on the second organic insulating layer 117. In this case, a wiring may be further disposed between the second organic insulating layer 117 and the third organic insulating layer.

The organic light-emitting diode OLED may be disposed on the second organic insulating layer 117. The organic light-emitting diode OLED may be disposed on the substrate 100 and implement a pixel. The organic light-emitting diode OLED may include a pixel electrode 211, an intermediate layer 212, and a counter electrode 213.

The pixel electrode 211 may be disposed on the second organic insulating layer 117. The pixel electrode 211 may be connected to the connection electrode CM through a contact hole of the second organic insulating layer 117. In an embodiment, the pixel electrode 211 may include a conductive oxide such as indium tin oxide ("ITO"), indium zinc oxide ("IZO"), zinc oxide (ZnO), indium oxide ($In_2O_3$), indium gallium oxide ("IGO"), or aluminum zinc oxide ("AZO"). In another embodiment, the pixel electrode 211 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a combination thereof. In another embodiment, the pixel electrode 211 may further include a film including ITO, IZO, ZnO, or $In_2O_3$ over/under the reflective film.

A pixel-defining film 118 in which an opening 1180P through which a central portion of the pixel electrode 211 is exposed may be disposed on the pixel electrode 211. The pixel-defining film 118 may include an organic insulating material and/or an inorganic insulating material. The opening 1180P may define an emission area of light emitted by the organic light-emitting diode OLED. In an embodiment, a width of the opening 1180P may correspond to a width of the emission area, for example. Also, a width of the opening 1180P may correspond to a width of a sub-pixel. In an embodiment, in FIGS. 5A through 5G, the opening 1180P of the pixel-defining film 118 may define the green sub-pixel Pg, for example.

The intermediate layer 212 may include a low molecular weight material or a high molecular weight material. When the intermediate layer 212 includes a low molecular weight material, the intermediate layer 212 may have a single or stacked structure in which a hole injection layer ("HIL"), a hole transport layer ("HTL"), an emission layer ("EML"), an electron transport layer ("ETL"), and an electron injection layer ("EIL") are stacked, and embodiments of the low molecular weight material may include various organic materials such as copper phthalocyanine (CuPc), N,N'-Di (napthalene-1-yl)-N,N'-diphenyl-benzidine ("NPB"), and tris-8-hydroxyquinoline aluminum ($Alq_3$). The above layers may be provided by vacuum deposition.

When the intermediate layer 212 includes a high molecular weight material, the intermediate layer 212 may have a structure including an HTL and an EML. In this case, the HTL may include poly(3,4-ethylenedioxythiophene) ("PEDOT"), and the EML may include a high molecular weight material such as a poly-phenylenevinylene ("PPV")-based polymer material or a polyfluorene-based polymer material. In an embodiment, the intermediate layer 212 may be provided by screen printing, inkjet printing, laser-induced thermal imaging ("LITI"), or the like.

However, the intermediate layer 212 is not necessarily limited thereto, and may have any of various other structures. The intermediate layer 212 may include a layer that is unitary over a plurality of pixel electrodes 211, or may include a layer that is patterned to correspond to each of a plurality of pixel electrodes 211.

The counter electrode 213 may include a conductive material having a low work function. In an embodiment, the counter electrode 213 may include a (semi-)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof, for example. In an alternative embodiment, the counter electrode 213 may further include a layer including ITO, IZO, ZnO, or $In_2O_3$ on the (semi-)transparent layer including the above material. The intermediate layer 212 and the counter electrode 213 may be provided by thermal evaporation.

A capping layer (not shown) for protecting the counter electrode 213 may be further disposed over the counter electrode 213. The capping layer may include LiF, an inorganic material, and/or an organic material.

The inorganic contact hole ICH through which the inorganic protective layer PVX is exposed at an edge of the first pixel area PA1 may be defined in the first organic insulating layer 116, the second organic insulating layer 117, and the pixel-defining film 118.

The inorganic contact hole ICH may be defined by extending a first hole 116H of the first organic insulating layer 116, a second hole 117H of the second organic insulating layer 117, and a third hole 118H of the pixel-defining film 118 to one another. Accordingly, a stepped portion may be provided on an inner surface of the inorganic contact hole ICH.

The counter electrode 213 may be disposed inside the inorganic contact hole ICH, so that the counter electrode 213 and the inorganic protective layer PVX including an inorganic material directly contact each other. In some embodiments, an end portion of the inorganic protective layer PVX may directly contact the counter electrode 213. Because parts of the first organic insulating layer 116, the second organic insulating layer 117, and the pixel-defining film 118 including an organic material are removed to define the inorganic contact hole ICH, penetration of moisture or a foreign material into the organic light-emitting diode OLED through the organic material may be prevented or reduced.

An encapsulation layer (not shown) may be disposed on the counter electrode 213. In an embodiment, the encapsulation layer may include at least one inorganic encapsulation layer and at least one organic encapsulation layer. In an embodiment, the at least one inorganic encapsulation layer may include at least one inorganic material from among aluminum oxide ($Al_2O_3$), titanium oxide ($TiO_2$), tantalum oxide ($Ta_2O_5$), hafnium oxide ($HfO_2$), zinc oxide (ZnO), silicon oxide ($SiO_2$), silicon nitride ($SiN_x$), and silicon oxynitride (SiON). The at least one organic encapsulation layer may include a polymer-based material. Examples of the polymer-based material may include an acrylic resin, an epoxy resin, polyimide, and polyethylene. In an embodiment, the at least one organic encapsulation layer may include acrylate.

A stacked structure of the display panel 10 disposed in the connection area CA will now be described in detail.

The lower organic insulating layer 115 may be disposed in the connection area CA of the display panel 10. In the illustrated embodiment, the second barrier layer 100d, the buffer layer 111, and the inorganic insulating layer IIL may be removed from the connection area CA having a high risk of cracks. Also, the lower organic insulating layer 115 may extend from the first pixel area PA1 to the connection area CA. Accordingly, even when the display panel 10 is deformed in the connection area CA, the risk of cracks in the display panel 10 may be prevented or reduced.

The lower organic insulating layer 115 may cover the end portions EG of the second barrier layer 100d, the buffer layer 111, and the inorganic insulating layer IL. The wiring WL may be disposed over the lower organic insulating layer 115. When the wiring WL is connected to the first pixel area PA1, the lower organic insulating layer 115 may minimize a height difference or may absorb stress that may be applied to the wirings WL.

In some embodiments, the second barrier layer 100d may also be disposed in the connection area CA. In this case, the second barrier layer 100d disposed in the first pixel area PA1 may be unitary with or spaced apart from the second barrier layer 100d disposed in the connection area CA. In this case, the lower organic insulating layer 115 may cover an end portion of the buffer layer 111 and an end portion of the inorganic insulating layer IIL, and may be disposed on the second barrier layer 100d.

In an embodiment, the lower organic insulating layer 115 may include an organic insulating material such as polyimide, polyamide, acrylic resin, benzocyclobutene, hexamethyldisiloxane ("HMDSO"), or a phenolic resin. The lower organic insulating layer 115 may have a single or multi-layer structure including the above organic insulating material.

The wiring WL may be disposed on the lower organic insulating layer 115. The wiring WL may extend from the first pixel area PA1 to the connection area CA. Accordingly, the wiring WL may apply a data signal, a scan signal, and/or a power supply voltage to the pixel circuit PC disposed in the first pixel area PA1.

The first organic insulating layer 116 may be disposed on the wiring WL and the lower organic insulating layer 115. Also, the second organic insulating layer 117 may be disposed on the first organic insulating layer 116. The first organic insulating layer 116 and the second organic insulating layer 117 may extend from the first pixel area PA1 to the connection area CA. In some embodiments, an upper wiring (not shown) may be further disposed between the first organic insulating layer 116 and the second organic insulating layer 117.

In an embodiment, the counter electrode 213 may be disposed on the second organic insulating layer 117 in the connection area CA. In another embodiment, the counter electrode 213 may not be disposed on the second organic insulating layer 117 in the connection area CA. The following will be described in detail assuming that the counter electrode 213 is disposed on the second organic insulating layer 117 in the connection area CA.

Referring to FIGS. 5A through 5F, a thickness 100t1 of the substrate 100 overlapping the connection area CA may be less than a thickness 100t2 of the substrate 100 overlapping the first pixel area PA1. In an embodiment, the first base layer 100a may overlap the first pixel area PA1, and may be spaced apart from the connection area CA. In other words, the first base layer 100a may overlap the first pixel area PA1, and may not overlap the connection area CA.

The thickness 100t1 of the substrate 100 overlapping the connection area CA may be a distance between a top surface of the substrate 100 and a bottom surface of the substrate 100 in the connection area CA. In an embodiment, in FIGS. 5A through 5F, the thickness 100t1 of the substrate 100 overlapping the connection area CA may be a distance between a bottom surface of the second base layer 100c and a top surface of the second base layer 100c, for example. The thickness 100t2 of the substrate 100 overlapping the first pixel area PA1 may be a distance between a top surface of the substrate 100 and a bottom surface of the substrate 100 in the first pixel area PA1. In an embodiment, in FIGS. 5A through 5F, the thickness 100t2 of the substrate 100 overlapping the first pixel area PA1 may be a distance between a bottom surface of the first base layer 100a and a top surface of the second barrier layer 100d, for example.

When the display panel 10 is stretched and/or contracted, strain may occur in the connection area CA. When the display panel 10 is stretched in the first direction (e.g., the x direction or the −x direction) and/or the second direction (e.g., the y direction or the −y direction), the connection area CA may be deformed. Also, a shape of the connection area CA may be changed not only in the first direction (e.g., the x direction or the −x direction) and/or the second direction (e.g., the y direction or the −y direction) but also in the third direction (e.g., the z direction or the −z direction) intersecting the first direction (e.g., the x direction or the −x direction) and the second direction (e.g., the y direction or the −y direction). As such, as a shape of the connection area CA is three-dimensionally changed, additional strain may occur. In this case, distortion and/or lift-off of the connection area CA may occur.

In an embodiment, the thickness 100t1 of the substrate 100 overlapping the connection area CA may be less than the thickness 100t2 of the substrate 100 overlapping the first pixel area PA1. In this case, even when strain occurs in the connection area CA, a maximum value of strain occurring on the top surface 10US of the connection area CA and the bottom surface 10LS in the connection area CA may be reduced. Accordingly, the reliability of the stretched display panel 10 may be improved.

Although the first barrier layer 100b is not disposed in the connection area CA in some embodiments, in another embodiment, the first barrier layer 100b may be disposed in the connection area CA. In this case, the first barrier layer 100b disposed in the first pixel area PA1 may be unitary with or spaced apart from the first barrier layer 100b disposed in the connection area CA.

Figure 5A:
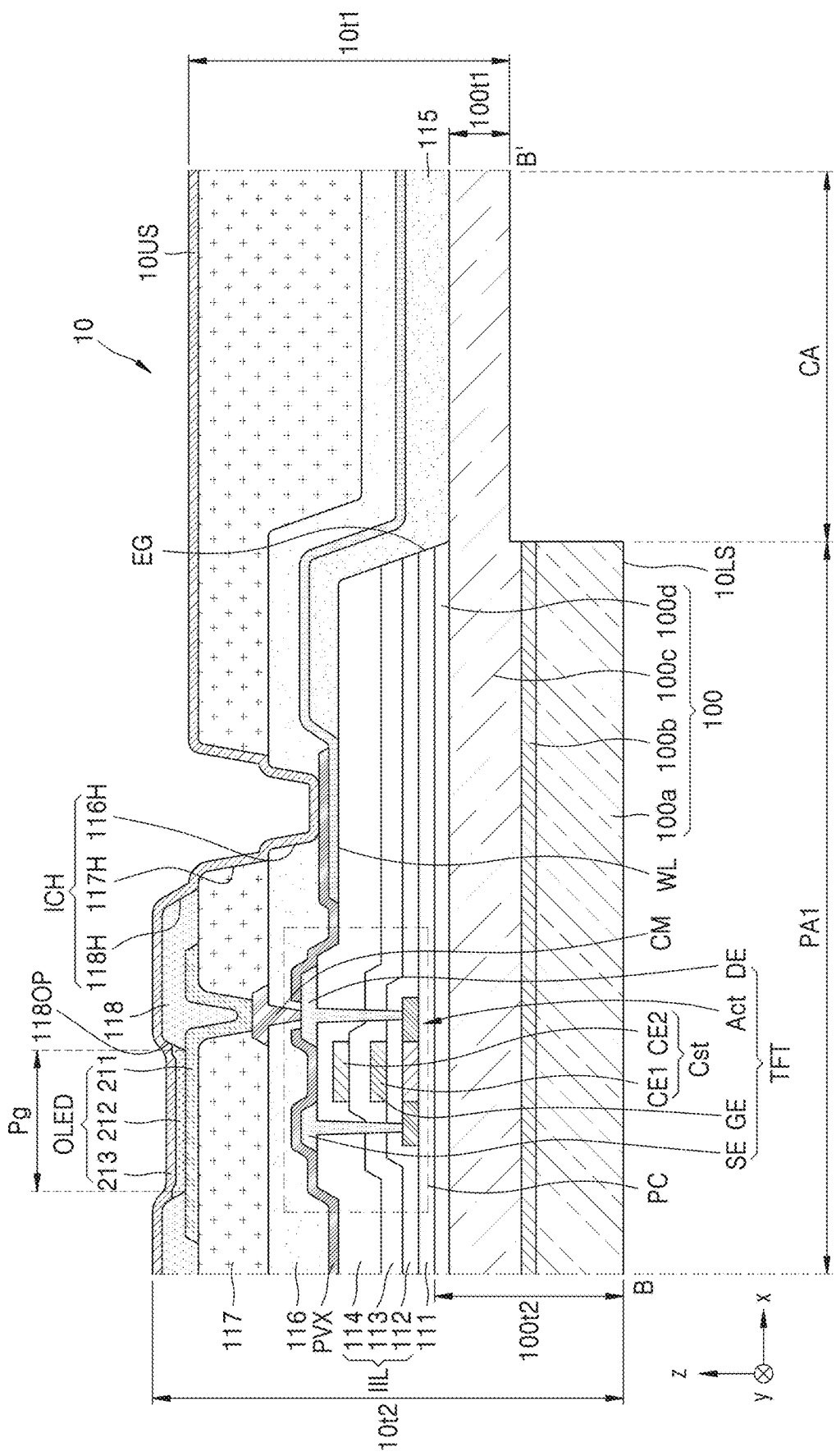
FIGS. 5A through 5G are cross-sectional views of embodiments of a display panel.
Figure 5B:
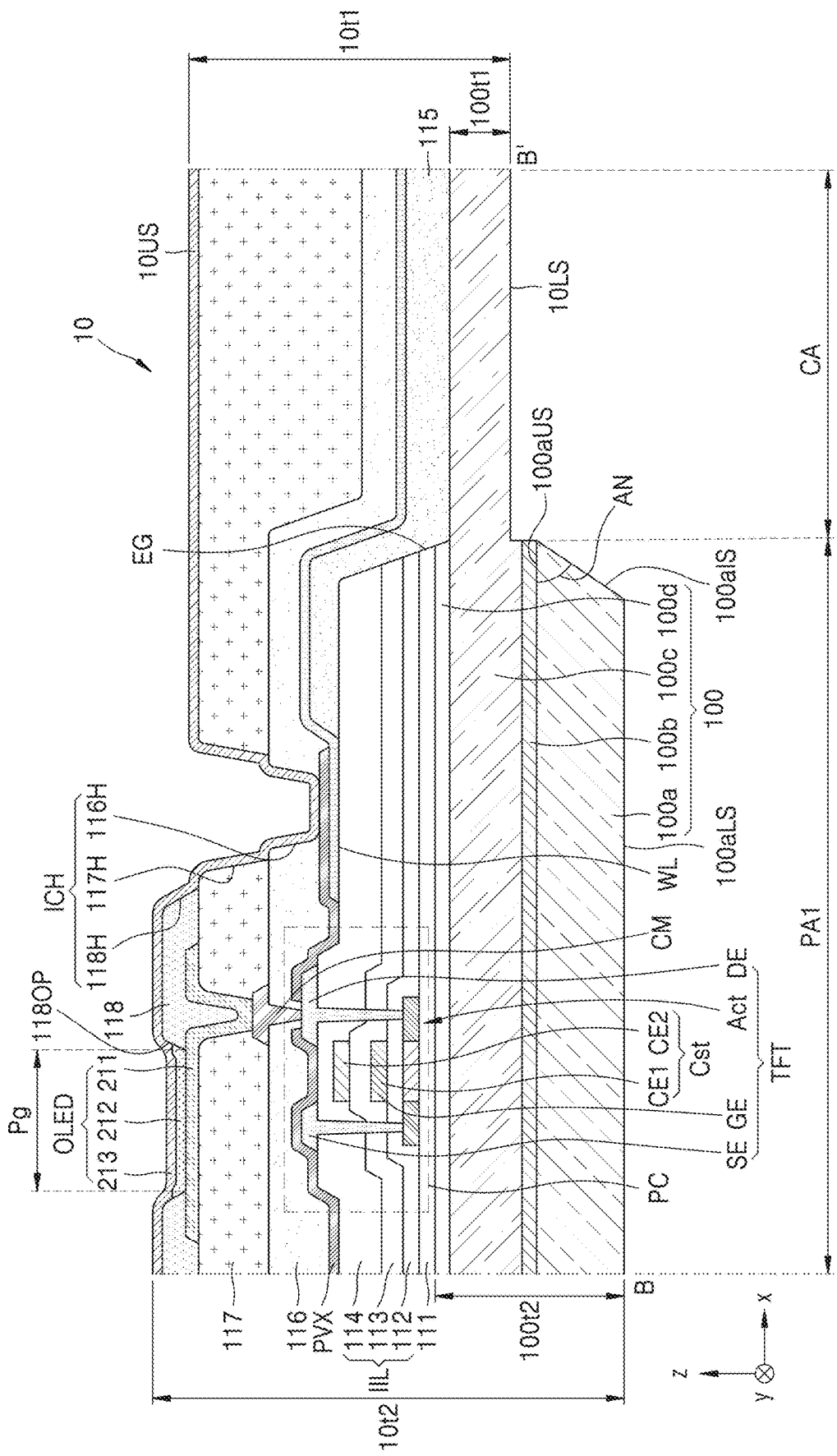

Referring to FIG. 5B, the first base layer 100a may include a top surface 100aUS of the first base layer 100a, a bottom surface 100aLS of the first base layer 100a, and an inclined surface 100aIS of the first base layer 100a. The top surface 100aUS of the first base layer 100a may be a surface facing the organic light-emitting diode OLED. The bottom surface 100aLS of the first base layer 100a may be a surface opposite to the top surface 100aUS of the first base layer 100a. The inclined surface 100aIS of the first base layer 100a may be inclined. In an embodiment, the inclined surface 100aIS of the first base layer 100a may meet the bottom surface 100aLS of the first base layer 100a and the top surface 100aUS of the first base layer 100a. An angle AN may be defined between the inclined surface 100aIS of the first base layer 100a and the top surface 100aUS of the first base layer 100a. In this case, the angle AN may range from about 0° to about 90°. When the display panel 10 is provided, the first base layer 100a may be entirely disposed on a support substrate (not shown), and then only at least a part of the first base layer 100a may be detached from the support substrate. In an embodiment, the first base layer 100a may be entirely disposed on the support substrate, for example. Next, the first base layer 100a overlapping the first pixel area PA1 may be detached from the support substrate, and the first base layer 100a overlapping the connection area CA may remain on the support substrate. In this case, because the angle AN ranges from about 0° to about 90°, the first base layer 100a overlapping the first pixel area PA1 may be easily detached.

Figure 5C:
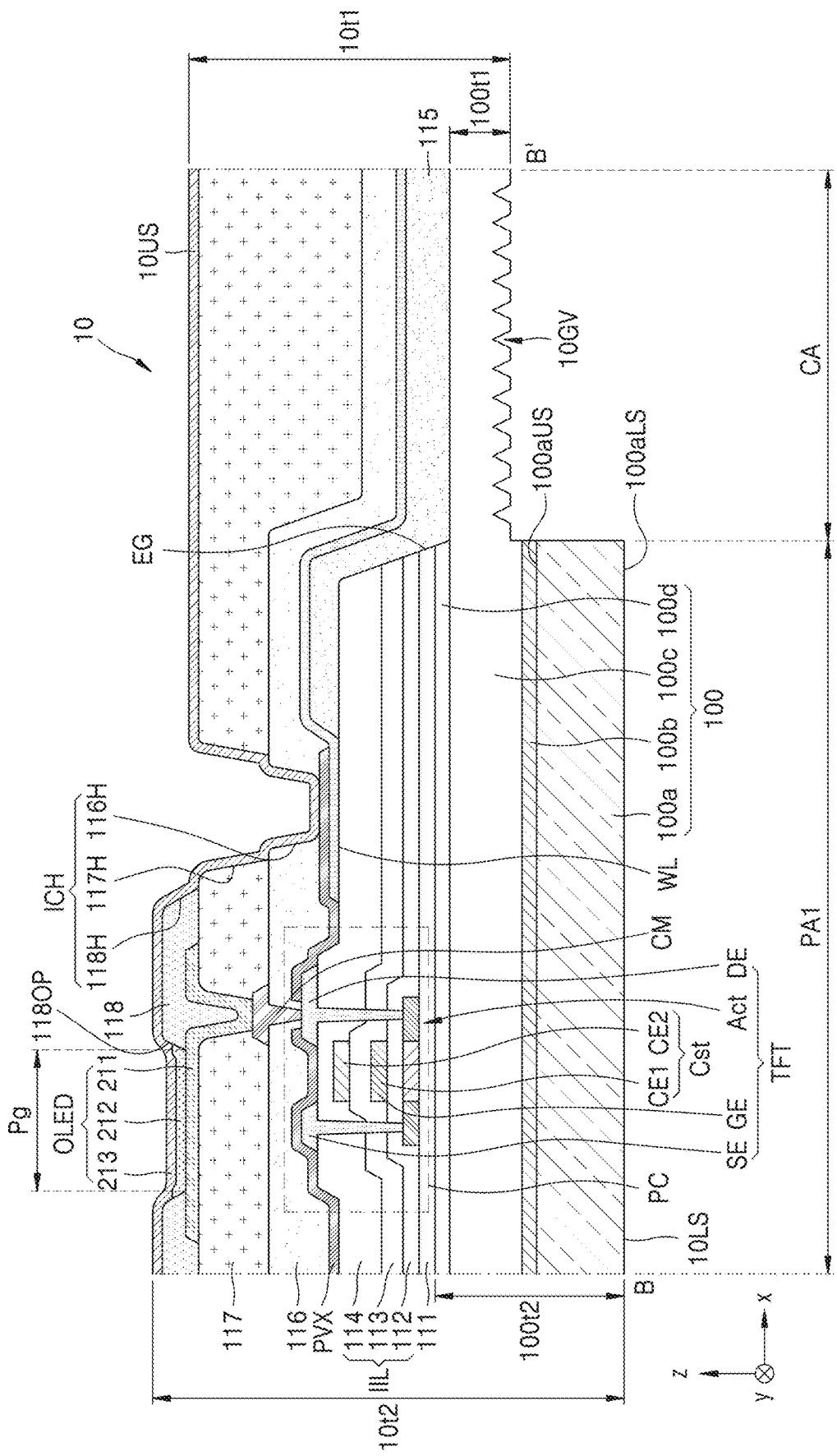

Referring to FIG. 5C, the display panel 10 may include the top surface 10US of the display panel 10 and the bottom surface 10LS of the display panel 10. In the connection area CA, a plurality of grooves 10GV may be defined in the bottom surface 10LS of the display panel 10. The plurality of grooves 10GV may be recessed from the bottom surface 10LS of the display panel 10 toward the top surface 10US of the display panel 10.

In an embodiment, the plurality of grooves 10GV may be defined in a bottom surface of the second base layer 100c in the connection area CA. In another embodiment, when the second base layer 100c is not disposed in the connection area CA, the plurality of grooves 10GV may be defined in a bottom surface of the lower organic insulating layer 115.

Although the plurality of grooves 10GV has the same shape in FIG. 5C, in another embodiment, a shape of one of the plurality of grooves 10GV may be different from that of another one of the plurality of grooves 10GV. Although the plurality of grooves 10GV has triangular shapes in FIG. 5C, in another embodiment, the plurality of grooves 10GV may have polygonal shapes such as quadrangular shapes or pentagonal shapes, or curved shapes.

Because the display panel 10 has flexibility, the display panel 10 may be manufactured on a relatively rigid support substrate. In this case, in order to reduce the first thickness 10t1 of the display panel 10 in the connection area CA, a pattern layer having low binding energy and/or bond strength with any one of elements of the display panel 10 may be provided. The pattern layer may include protrusions, and the plurality of grooves 10GV may be defined in the bottom surface 10LS of the display panel 10 disposed on the protrusions in the connection area CA. Accordingly, the display panel 10 may be easily detached from the pattern layer.

Figure 5D:
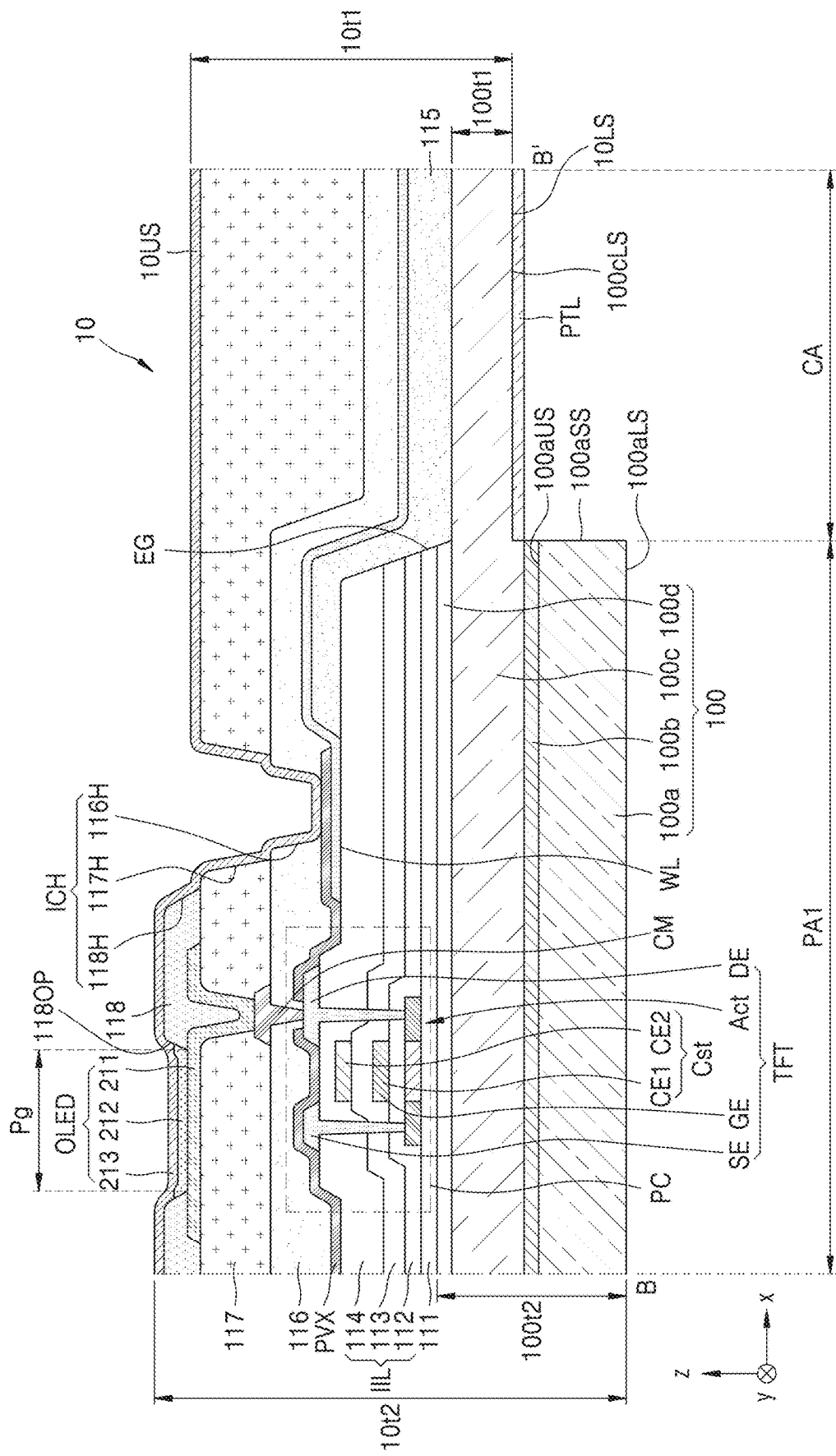
Figure 5E:
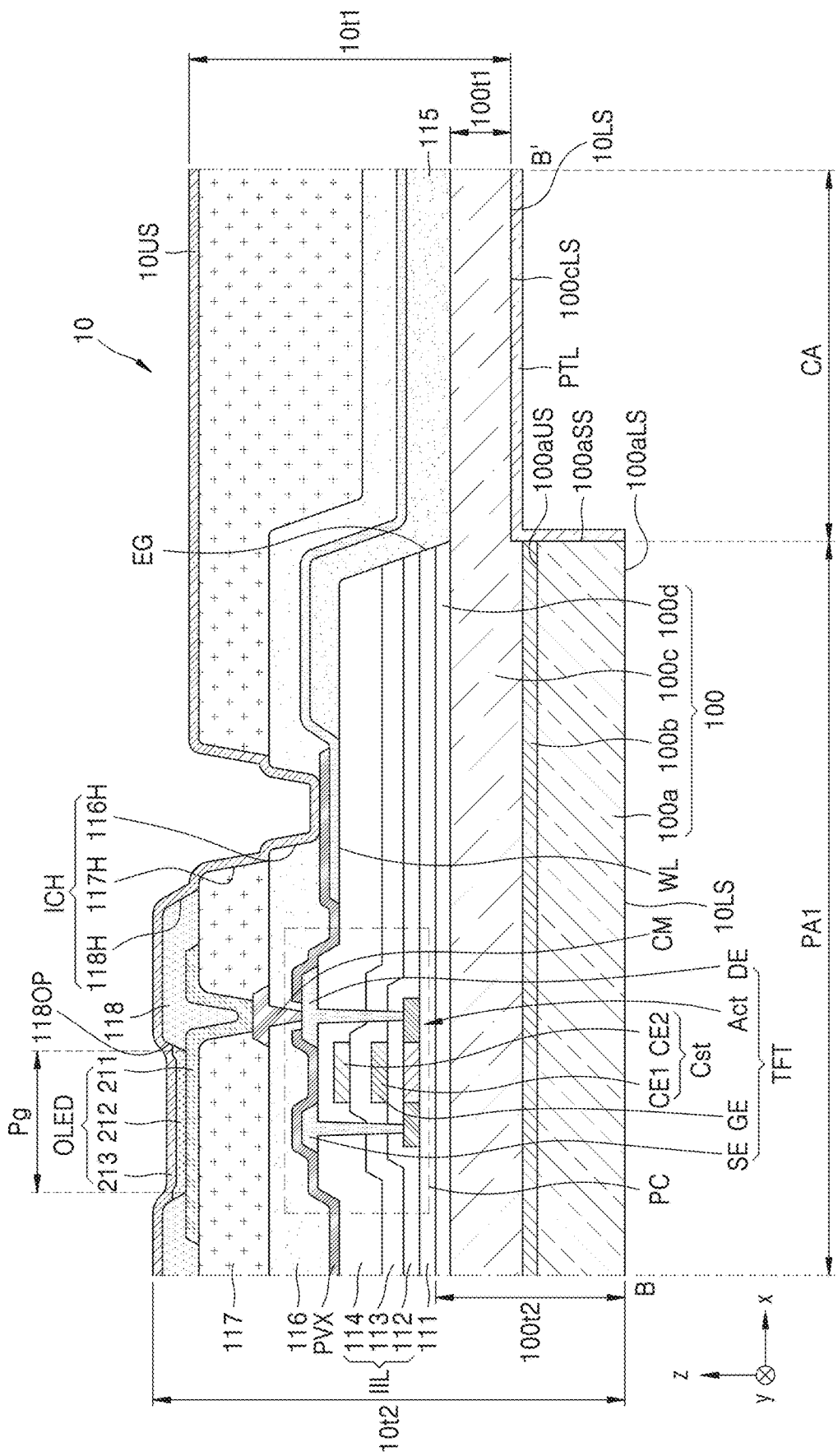
Figure 5F:
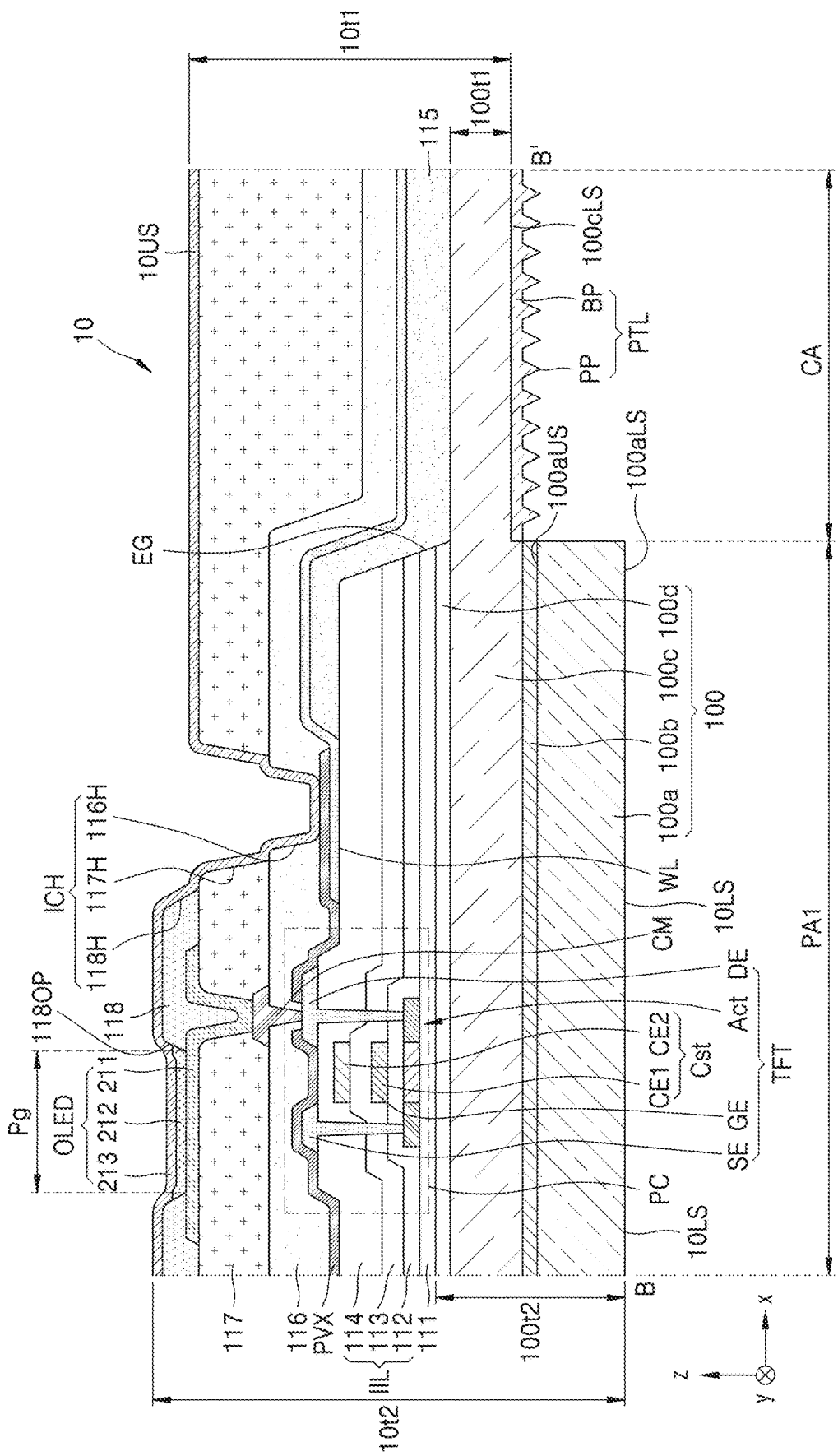

Referring to FIGS. 5D through 5F, a pattern layer PTL may be disposed on the bottom surface 10LS of the display panel 10. The pattern layer PTL may overlap the connection area CA of the display panel 10. In an embodiment, the pattern layer PTL may be disposed on a bottom surface 100cLS of the second base layer 100c. In another embodiment, when the substrate 100 is not disposed in the connection area CA, the pattern layer PTL may be disposed on a bottom surface of the lower organic insulating layer 115. The following will be described in detail assuming that the pattern layer PTL is disposed on the bottom surface 100cLS of the second base layer 100c.

The pattern layer PTL may be a layer for reducing the first thickness 10t1 of the display panel 10 in the connection area CA. When the display panel 10 is manufactured, the pattern layer PTL may reduce bond strength between a layer disposed over the pattern layer PTL and a layer disposed under the pattern layer PTL. Accordingly, the pattern layer PTL may separate the layer disposed over the pattern layer PTL from the layer disposed under the pattern layer PTL.

In an embodiment, the pattern layer PTL may include graphene oxide. In another embodiment, the pattern layer PTL may include polytetrafluoroethylene ("PTFE"). In another embodiment, the pattern layer PTL may include graphite. As such, the pattern layer PTL may include a material having low binding energy and/or bond strength with a base layer and a barrier layer. In an embodiment, a modulus of the pattern layer PTL may be equal to or less than a modulus of the barrier layer.

In an embodiment, the pattern layer PTL may be a single layer, multiple layers, or a composite layer including various materials. In an embodiment, the pattern layer PTL may further include a material that is not removed in an etching process.

Referring to FIG. 5D, the pattern layer PTL may be disposed on the bottom surface 100cLS of the second base layer 100c. The pattern layer PTL may not be disposed on a side surface 100aSS of the first base layer 100a. The side surface 100aSS of the first base layer 100a may be a surface meeting the bottom surface 100aLS of the first base layer 100a and the top surface 100aUS of the first base layer 100a. The side surface 100aSS of the first base layer 100a may face the connection area CA.

Referring to FIG. 5E, the pattern layer PTL may be disposed on the bottom surface 100cLS of the second base layer 100c. Also, the pattern layer PTL may also be disposed on the side surface 100aSS of the first base layer 100a. The pattern layer PTL may extend from the bottom surface 100cLS of the second base layer 100c to the side surface 100aSS of the first base layer 100a.

Referring to FIG. 5F, the pattern layer PTL may include a plurality of protrusions PP. In other words, the pattern layer PTL may include a body portion BP and the protrusions PP. The protrusions PP may be portions protruding from the body portion BP. The plurality of protrusions PP may protrude from at least one of a top surface of the body portion BP and a bottom surface of the body portion BP. Although the plurality of protrusions PP protrudes from the bottom surface of the body portion BP in FIG. 5F, in another embodiment, the plurality of protrusions PP may protrude from the top surface of the body portion BP or may protrude from both the bottom surface of the body portion BP and the top surface of the body portion BP.

Although the plurality of protrusions PP has the same shape in FIG. 5F, in another embodiment, a shape of one of the plurality of protrusions PP may be different from that of another one of the plurality of protrusions PP. Although the plurality of protrusions PP has triangular shapes in FIG. 5F, in another embodiment, the plurality of protrusions PP may have polygonal shapes such as quadrangular shapes or pentagonal shapes, or curved shapes.

In the illustrated embodiment, in order to reduce the first thickness 10t1 of the display panel 10 in the connection area CA, the pattern layer PTL having low binding energy and/or bond strength with any one of elements of the display panel 10 may be provided. Also, because the pattern layer PTL includes the plurality of protrusions PP, a layer disposed under the pattern layer PTL may be easily detached from the pattern layer PTL.

Figure 5G:
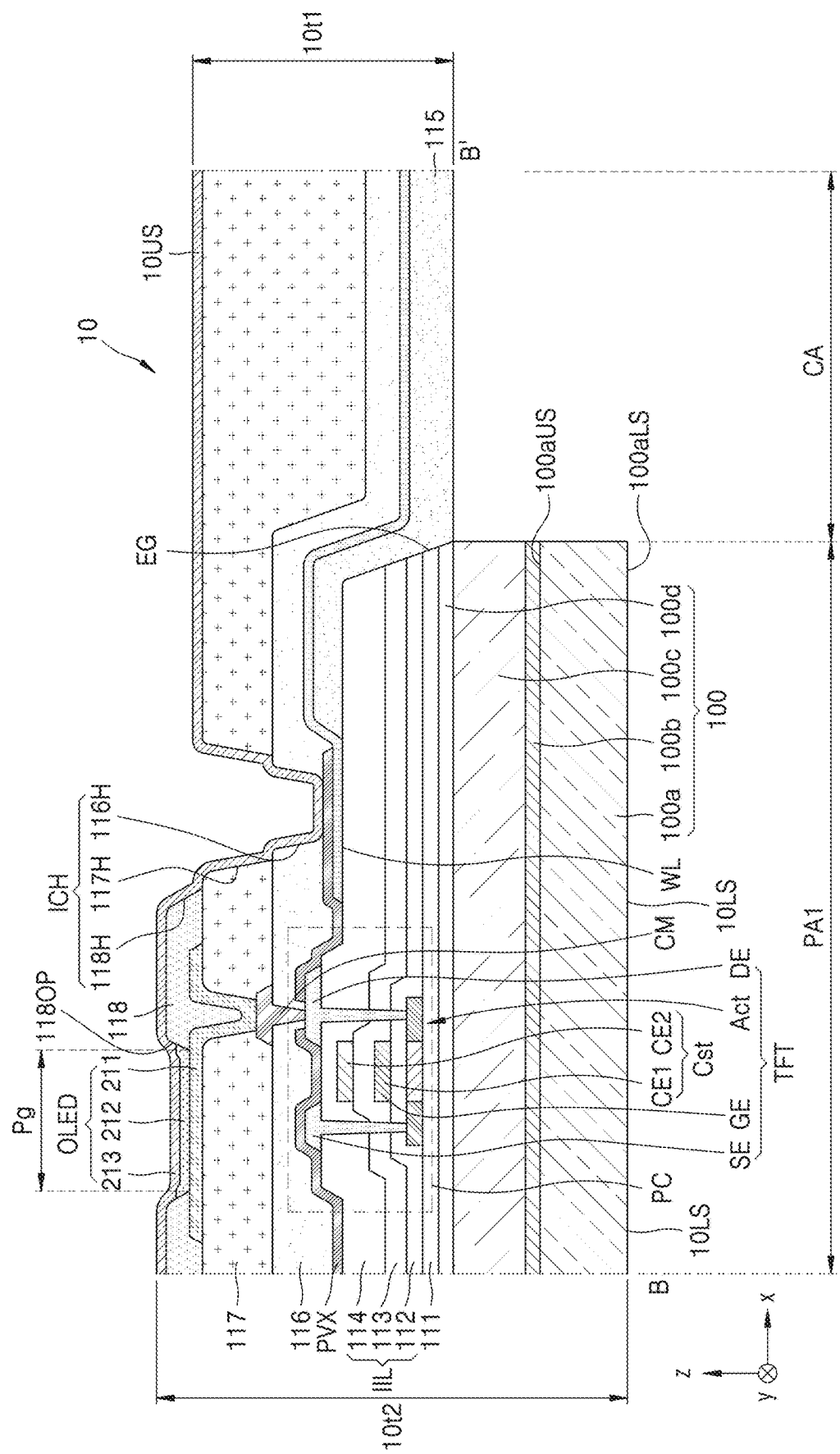

Referring to FIG. 5G, the substrate 100 may overlap the first pixel area PA1 and may be spaced apart from the connection area CA. That is, the substrate 100 may not overlap the connection area CA. In an embodiment, the first base layer 100a, the first barrier layer 100b, the second base layer 100c, and the second barrier layer 100d may overlap the first pixel area PA1, for example. The first base layer 100a, the first barrier layer 100b, the second base layer 100c, and the second barrier layer 100d may not overlap the connection area CA. Accordingly, the first thickness 10t1 of the display panel 10 in the connection area CA may be less than the second thickness 10t2 of the display panel in the first pixel area PA1.

The lower organic insulating layer 115, the first organic insulating layer 116, and the second organic insulating layer 117 may be disposed on the substrate 100 in the first pixel area PA1. At least one of the lower organic insulating layer 115, the first organic insulating layer 116, and the second organic insulating layer 117 may extend from the first pixel area PA1 to the connection area CA. In an embodiment, the lower organic insulating layer 115, the first organic insulating layer 116, and the second organic insulating layer 117 may each extend from the first pixel area PA1 to the connection area CA, for example.

In an embodiment, the lower organic insulating layer 115 may be the bottom surface 10LS of the display panel 10. In this case, the first thickness 10t1 of the display panel 10 in the connection area CA may be a distance between the top surface 10US of the display panel 10 and a bottom surface of the lower organic insulating layer 115. In some embodiments, a pattern layer may be further disposed on the bottom surface of the lower organic insulating layer 115.

FIGS. 6A through 6D are cross-sectional views of embodiments of a display panel. FIGS. 6A through 6D are cross-sectional views taken along line C-C' of the display panel 10 of FIG. 4A.

Referring to FIGS. 6A through 6D, the display panel in which the through-opening POP is defined may include the connection area CA. No element of the display panel may be disposed in the through-opening POP. At least a part of the through-opening POP may be defined by the edge CAE of the connection area CA.

In the connection area CA, the second base layer 100c, the lower organic insulating layer 115, the wiring WL, the first organic insulating layer 116, and the second organic insulating layer 117 may be sequentially disposed. Also, the counter electrode 213 may be disposed on the second organic insulating layer 117. In an embodiment, the wiring WL may be disposed between the lower organic insulating layer 115 and the first organic insulating layer 116. Although a plurality of wirings WL is disposed in FIGS. 6A through 6D, in another embodiment, one wiring WL may be disposed in the connection area CA.

Figure 6A:
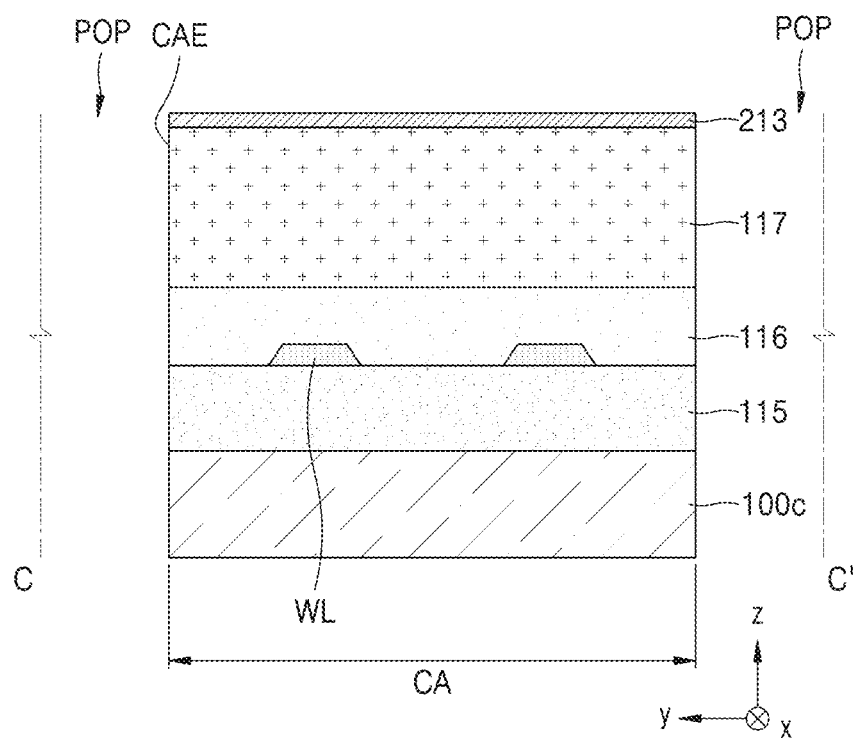
FIGS. 6A through 6D are cross-sectional views of embodiments of a display panel.

An edge of the second base layer 100c, an edge of the lower organic insulating layer 115, an edge of the first organic insulating layer 116, and an edge of the second organic insulating layer 117 may define the edge CAE of the connection area CA. Referring to FIG. 6A, an edge of the second base layer 100c, an edge of the lower organic insulating layer 115, an edge of the first organic insulating layer 116, and an edge of the second organic insulating layer 117 may be aligned with one another.

In some embodiments, the second base layer 100c may be omitted. In this case, a bottom surface of the display panel in the connection area CA may be a bottom surface of the lower organic insulating layer 115.

In some embodiments, an upper wiring may be further disposed between the first organic insulating layer 116 and the second organic insulating layer 117. In some embodiments, a third organic insulating layer (not shown) may be further disposed between the second organic insulating layer 117 and the counter electrode 213. In this case, a wiring may be further disposed between the second organic insulating layer 117 and the third organic insulating layer.

In some embodiments, a pattern layer may be further disposed on the bottom surface of the display panel.

Figure 6B:
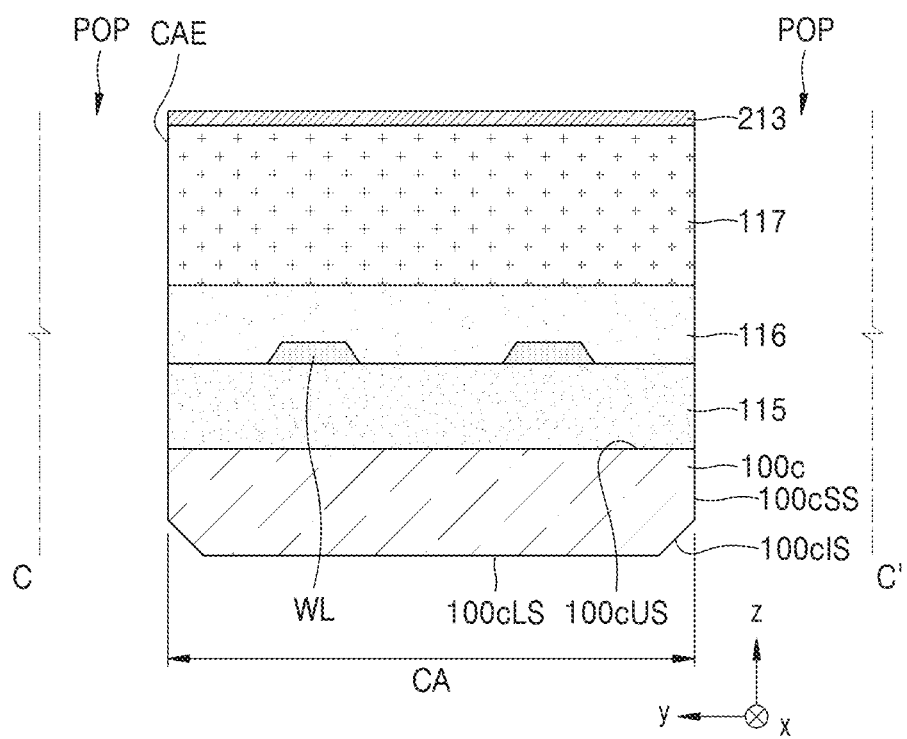

Referring to FIG. 6B, the second base layer 100c may include the bottom surface 100cLS of the second base layer 100c, a top surface 100cUS of the second base layer 100c, a side surface 100cSS of the second base layer 100c, and an inclined surface 100cIS of the second base layer 100c. The top surface 100cUS of the second base layer 100c may be a surface facing the wiring WL. The bottom surface 100cLS of the second base layer 100c may be a surface opposite to the top surface 100cUS of the second base layer 100c.

The inclined surface 100cIS of the second base layer 100c may be inclined. In an embodiment, the inclined surface 100cIS of the second base layer 100 may meet the bottom surface 100cLS of the second base layer 100c. A side of the inclined surface 100cIS of the second base layer 100c may meet the bottom surface 100cLS of the second base layer 100c, and the other side of the inclined surface 100cIS of the second base layer 100c may meet the side surface 100cSS of the second base layer 100c. The inclined surface 100cIS of the second base layer 100c may intersect the side surface 100cSS of the second base layer 100c.

The side surface 100cSS of the second base layer 100c may meet the inclined surface 100cIS of the second base layer 100c and the top surface 100cUS of the second base layer 100c. The side surface 100cSS of the second base layer 100c may intersect the top surface 100cUS of the second base layer 100c.

Figure 6C:
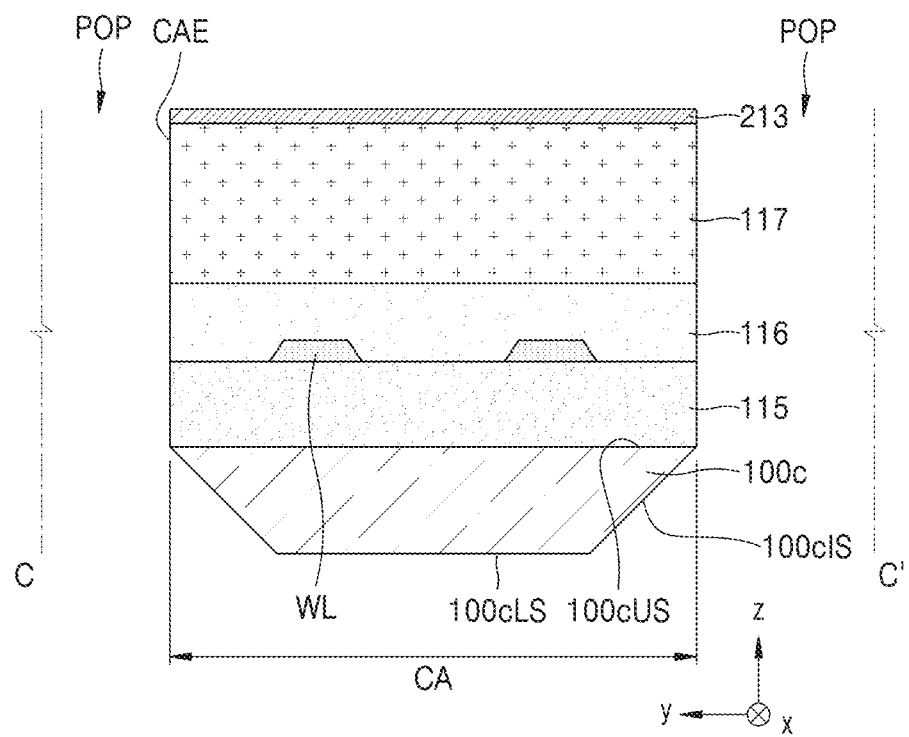

Referring to FIG. 6C, the second base layer 100c may include the bottom surface 100cLS of the second base layer 100c, the top surface 100cUS of the second base layer 100c, and the inclined surface 100cIS of the second base layer 100c. The top surface 100cUS of the second base layer 100c may be a surface facing the wiring WL. The bottom surface 100cLS of the second base layer 100c may be a surface opposite to the top surface 100cUS of the second base layer 100c.

The inclined surface 100cIS of the second base layer 100c may be inclined. In an embodiment, the inclined surface 100cIS of the second base layer 100c may meet the bottom surface 100cLS of the second base layer 100c. A side of the inclined surface 100cIS of the second base layer 100c may meet the bottom surface 100cLS of the second base layer 100c, and the other side of the inclined surface 100cIS of the second base layer 100c may meet the top surface 100cUS of the second base layer 100c.

Because the display panel has flexibility, the display panel may be manufactured on a relatively rigid support substrate. In this case, in order to detach the display panel from the support substrate, a pattern layer having low binding energy and/or bond strength with any one of elements of the display panel may be disposed on the support substrate, and the display panel may be provided. Also, the second base layer 100c may be disposed over the pattern layer in the connection area CA. Because the inclined surface 100cIS of the second base layer 100c is provided in the connection area CA, the area of the bottom surface 100cLS of the second base layer 100c in the connection area CA may be less than the area of a top surface of the pattern layer. Accordingly, the display panel may be easily detached from the pattern layer.

Figure 6D:
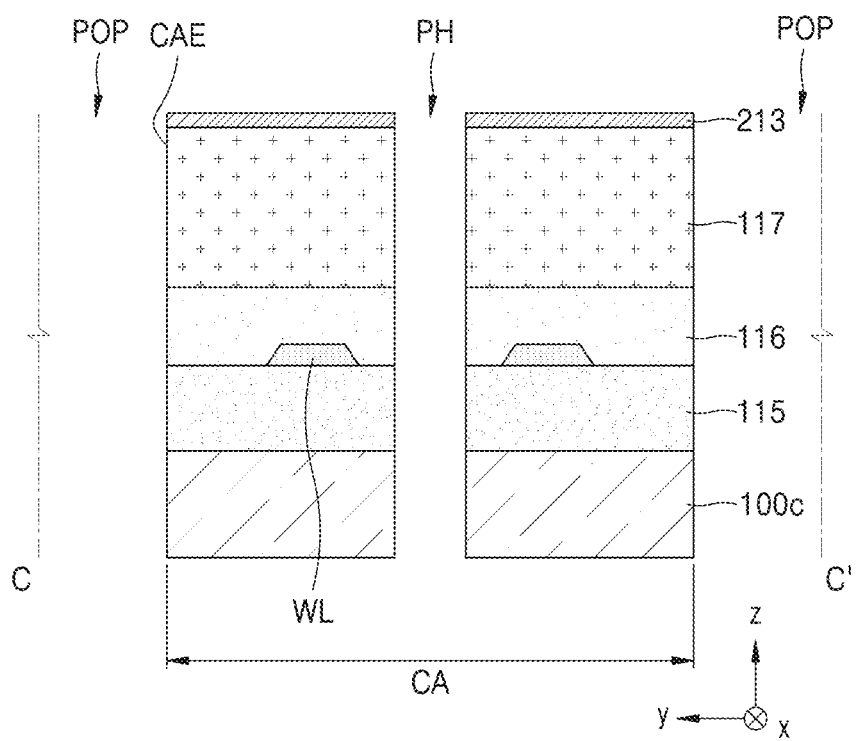

Referring to FIG. 6D, a through-hole PH may be defined in the display panel in the connection area CA. The through-hole PH may pass through the display panel. The through-hole PH may be spaced apart from the through-opening POP. In an embodiment, the through-hole PH may extend in an extending direction of the connection area CA. In an embodiment, when the connection area CA extends in the first direction (e.g., the x direction or the −x direction), the through-hole PH may extend in the first direction (e.g., the x direction or the −x direction), for example.

Because the display panel has flexibility, the display panel may be manufactured on a relatively rigid support substrate. In this case, in order to detach the display panel from the support substrate, a pattern layer having low binding energy and/or bond strength with any one of elements of the display panel may be disposed on the support substrate, and the display panel may be provided. Because the through-hole PH is defined in the display panel in the connection area CA, the area of a bottom surface of the second base layer 100c may be less than the area of a top surface of the pattern layer in the connection area CA. Accordingly, the display panel may be easily detached from the pattern layer.

Figure 7A:
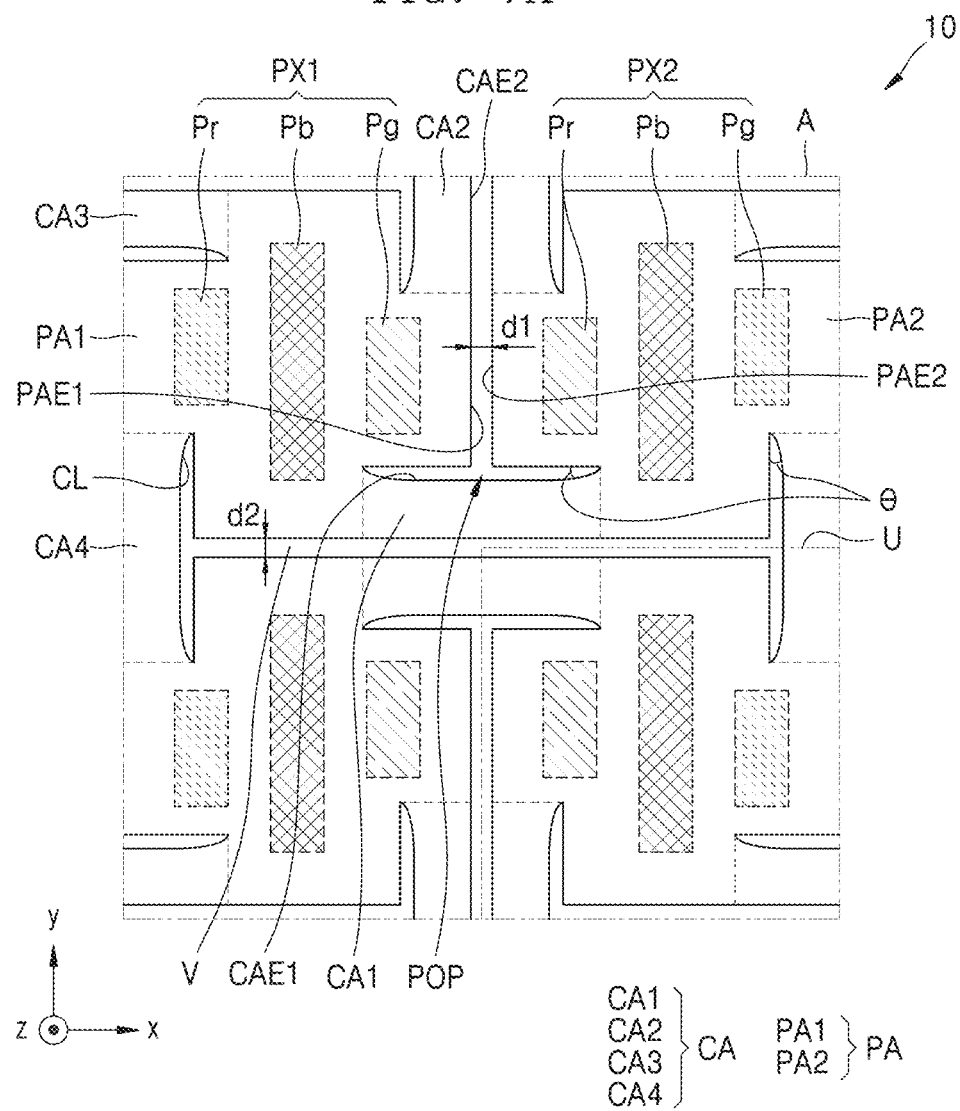
FIG. 7A is an enlarged view illustrating an embodiment of a display panel.
Figure 7B:
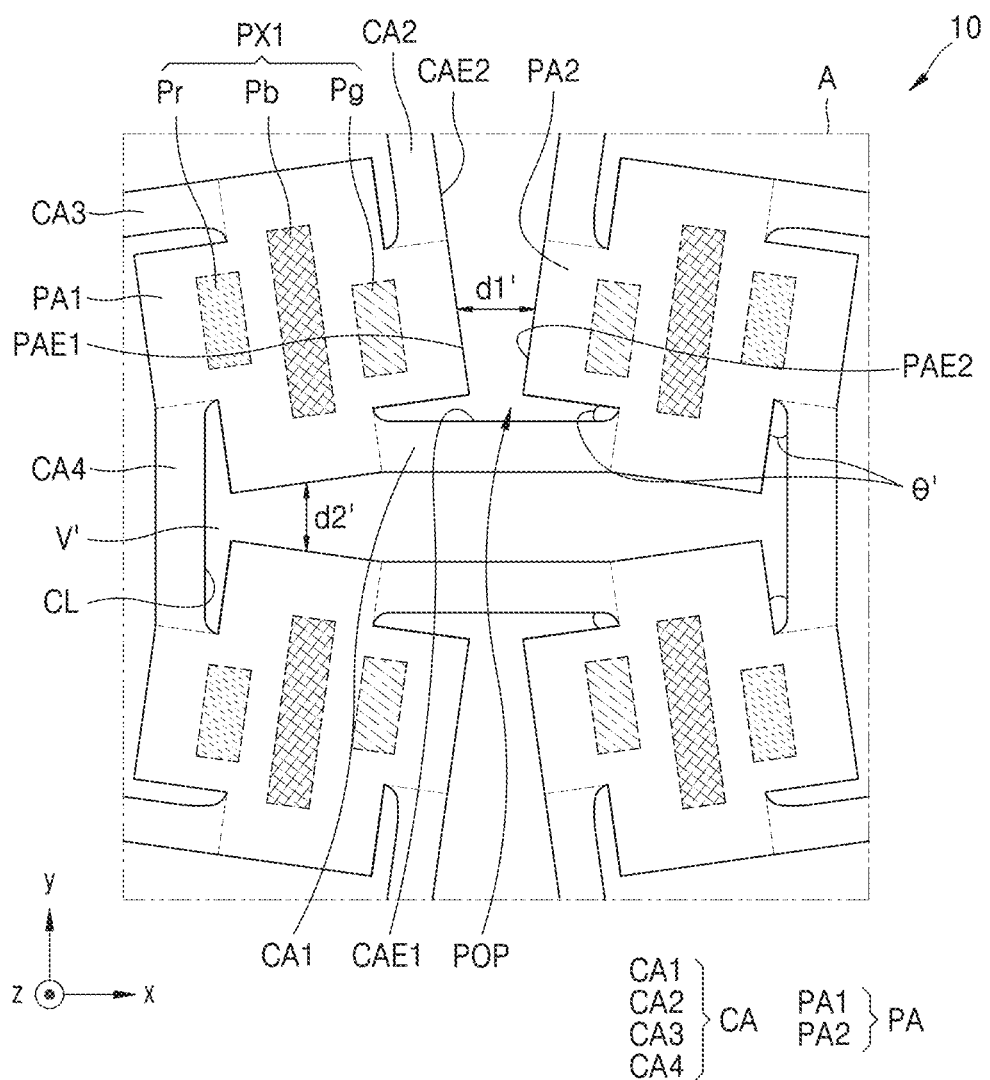
FIG. 7B is a plan view illustrating an embodiment of a display panel stretched in a first direction and a second direction.

FIG. 7A is an enlarged view illustrating an embodiment of a display panel. FIG. 7B is a plan view illustrating an embodiment of a display panel stretched in a first direction and a second direction. FIGS. 7A and 7B are enlarged views illustrating an embodiment of a portion A of the display panel 10 of FIG. 2.

Referring to FIG. 7A, the display panel 10 may include the pixel area PA and the connection area CA. A width of the pixel area PA may be greater than a width of the connection area CA. A width of the first pixel area PA1 may be a distance between the edges PAE1 of the first pixel area PA1 facing each other in a direction perpendicular to an extending direction of the connection area CA. A width of the connection area CA may be a distance between the edges of the connection area CA facing each other in the direction perpendicular to the extending direction of the connection area CA. In this case, even when strain occurs in the connection area CA, a maximum value of strain occurring at an edge of the connection area CA may be reduced. Accordingly, the reliability of the stretched display panel 10 may be improved.

In an embodiment, a thickness of the display panel 10 in the connection area CA may be less than a thickness of the display panel 10 in the pixel area PA. A stacked structure of the display panel 10 described with reference to FIG. 7A may be similar to a stacked structure of the display panel 10 described with reference to FIGS. 5A through 5G. Accordingly, even when strain occurs in the connection area CA, a maximum value of strain occurring in the connection area CA may be reduced.

The pixel area PA may include the first pixel area PA1 and the second pixel area PA2. The first pixel PX1 may be disposed in the first pixel area PA1. The second pixel PX2 may be disposed in the second pixel area PA2. The connection area CA may include a first connection area CA1, a second connection area CA2, a third connection area CA3, and a fourth connection area CA4.

A plurality of pixel areas PA may be spaced apart from one another in the first direction (e.g., the x direction or the −x direction) and/or the second direction (e.g., the y direction or the −y direction). In an embodiment, the plurality of pixel areas PA may be spaced apart from one another by a first interval d1 and a second interval d2. In an embodiment, the first pixel area PA1 and the second pixel area PA2 may be spaced apart from each other in the first direction (e.g., the x direction or the −x direction) and/or the second direction (e.g., the y direction or the −y direction), for example.

The connection area CA may extend between adjacent pixel areas PA. In an embodiment, each pixel area PA may be adjacent to four connection areas CA. Four connection areas CA adjacent to one pixel area PA may extend in different directions, and each connection area CA may be adjacent to another pixel area PA adjacent to the one pixel area PA.

In an embodiment, the first connection area CA1 may extend from the first pixel area PA1 to the second pixel area PA2. Accordingly, the first pixel area PA1 and the second pixel area PA2 may be adjacent to each other by the first connection area CA1, and the first pixel area PA1, the second pixel area PA2, and the first connection area CA1 may be unitary with one another.

The through-opening POP may be defined in the display panel 10. The first pixel area PA1 and the second pixel area PA2 may be spaced apart from each other with the through-opening POP therebetween. The through-opening POP may pass through the display panel 10. Accordingly, no element of the display panel 10 may be disposed in the through-opening POP.

In an embodiment, at least a part of the through-opening POP may be defined by the edge PAE1 of the first pixel area PA1, the edge PAE2 of the second pixel area PA2, and an edge CAE1 of the first connection area CA1. In an embodiment, at least a part of the through-opening POP may be defined by the edge PAE1 of the first pixel area PA1, the edge PAE2 of the second pixel area PA2, the edge CAE1 of the first connection area CA1, and an edge CAE2 of the second connection area CA2.

One pixel area PA and some of connection areas CA extending form the one pixel area PA may be defined as one basic unit U. The base units U may be repeatedly arranged in the first direction (e.g., the x direction or the −x direction) and the second direction (e.g., the y direction or the −y direction), and the display panel 10 may be provided by connecting the repeatedly arranged basic units U. Two adjacent basic units U may be symmetric to each other. In an embodiment, two basic units U horizontally adjacent to each other in FIG. 7A may be symmetric to each other about a symmetry axis parallel to the second direction (e.g., the y direction or the −y direction), for example. Likewise, two basic units U vertically adjacent to each other in FIG. 7A may be symmetric to each other about a symmetry axis parallel to the first direction (e.g., the x direction or the −x direction).

From among a plurality of basic units U, adjacent basic units U, for example, four basic units of FIG. 7A, may have a closed curved line CL provided therebetween, and the closed curved line CL may define a separation area V that is an empty space. The separation area V may be defined by the closed curved line CL including edges of a plurality of pixel areas PA and edges of a plurality of connection areas CA. Each separation area V may pass through a top surface and a bottom surface of the display panel 10. The separation area V may overlap the through-opening POP of the display panel 10.

In an embodiment, an angle θ between the edge CAE1 of the first connection area CA1 and the edge PAE2 of the second pixel area PA2 may be an acute angle. When an external force for pulling the display panel 10 is applied, as shown in FIG. 7B, an angle θ' (θ'>θ) between the edge CAE1 of the first connection area CA1 and the edge PAE2 of the second pixel area PA2 may increase, the area or shape of a separation area V' may be changed, and a position of the pixel area PA may also be changed.

When the external force is applied, through the change in the angle θ', the increase in the area of the separation area V', and/or the change in the shape, each pixel area PA may rotate at a predetermined angle. Due to the rotation of each pixel area PA, an interval between the pixel areas PA, for example, a first interval d1' and a second interval d2', may be different according to positions.

When an external force for pulling the display panel 10 is applied, stress may concentrate on the edge CAE1 of the first connection area CA1 and the edge PAE2 of the second pixel area PA2. Accordingly, in order to prevent damage to the display panel 10, the closed curved line CL that defines the separation area V may include a curved line.

The first pixel PX1 and the second pixel PX2 may respectively overlap the first pixel area PA1 and the second pixel area PA2. In an embodiment, each of the first pixel PX1 and the second pixel PX2 may include a red sub-pixel Pr, a green sub-pixel Pg, and a blue sub-pixel Pb. In another embodiment, each of the first pixel PX1 and the second pixel PX2 may include the red sub-pixel Pr, a green sub-pixel Pg, a blue sub-pixel Pb, and a white sub-pixel.

A method of manufacturing a display apparatus in which a thickness of the display panel 10 in the connection area CA is less than a thickness of the display panel 10 in the pixel area PA as described above will now be described.

Figure 8:
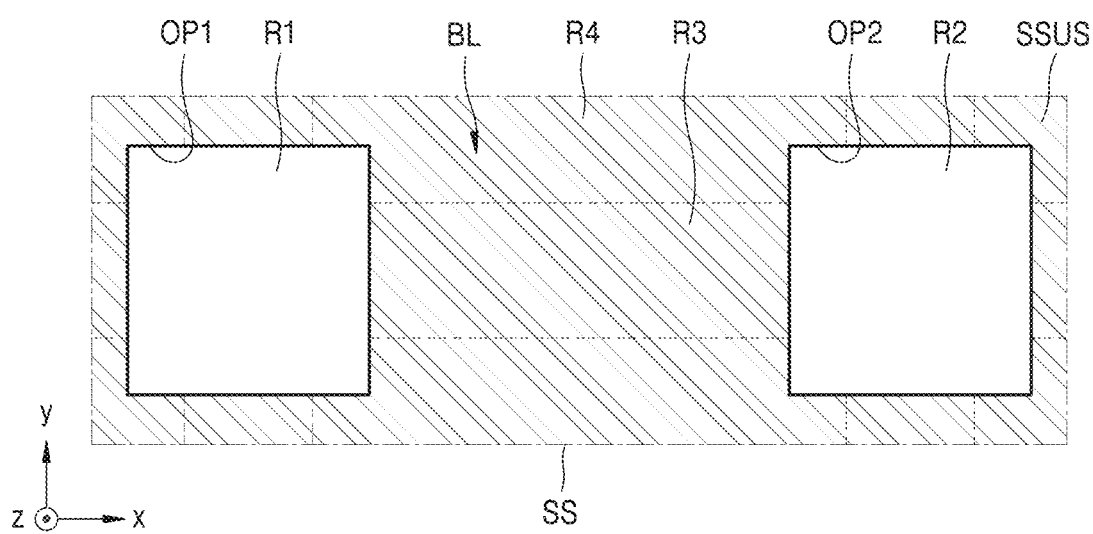
FIG. 8 is a plan view illustrating an embodiment of a method of forming a shield layer on a support substrate.
Figure 9:
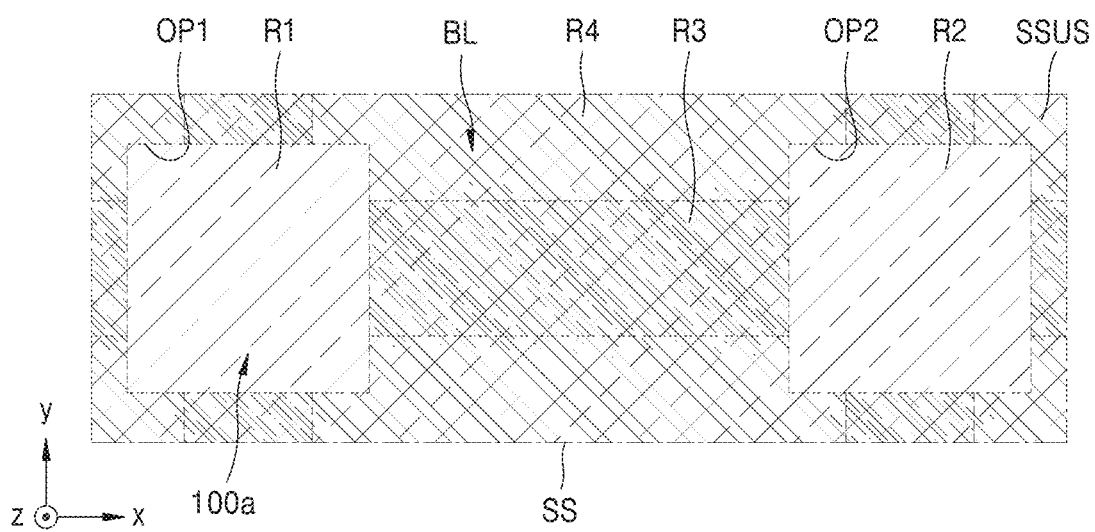
FIG. 9 is a plan view illustrating an embodiment of a method of forming a first base layer.

FIG. 8 is a plan view illustrating an embodiment of a method of forming a shield layer BL on a support substrate SS. FIG. 9 is a plan view illustrating an embodiment of a method of forming the first base layer 100a.

Referring to FIG. 8, the support substrate SS may be prepared. The support substrate SS may include a material, for example, a glass material, having hardness and rigidness sufficient to support a manufactured display panel and/or display apparatus.

The support substrate SS may include a first region R1, a second region R2, a third region R3, and a fourth region R4. The first region R1 may be spaced apart from the second region R2. The first region R1 may be adjacent to the third region R3. In an embodiment, the first region R1 may be adjacent to at least one third region R3. In an embodiment, the first region R1 may be adjacent to one third region R3, for example. In an alternative embodiment, the first region R1 may be adjacent to a plurality of third regions R3. The first region R1 may be a region where a first pixel area of the display panel described below is provided.

The second region R2 may be spaced apart from the first region R1. The second region R2 may be adjacent to the third region R3. In an embodiment, the second region R2 may be adjacent to at least one third region R3. The second region R2 may be a region where a second pixel area of the display panel described below is provided.

The third region R3 may extend from the first region R1 to the second region R2. Accordingly, the first region R1 and the second region R2 may be adjacent to each other by the third region R3. In an embodiment, when the support substrate SS includes a plurality of third regions R3, the plurality of third regions R3 may be adjacent to the first region R1 and/or the second region R2. In an alternative embodiment, the plurality of third regions R3 may extend from the first regions R1 and/or the second regions R2. The third regions R3 may be regions where a connection area of the display panel described below is provided.

One of the plurality of third regions R3 may extend in the first direction (e.g., the x direction or the -x direction). Another one of the plurality of third regions R3 may extend in the second direction (e.g., the y direction or the -y direction).

The fourth region R4 may be a region outside the first region R1, the second region R2, and the third region R3. That is, the fourth region R4 may be a region other than the first region R1, the second region R2, and the third region R3 of the support substrate SS. The fourth region R4 may be a region where a through-opening of the display panel described below is provided.

The shield layer BL may be disposed on the support substrate SS. The shield layer BL may be disposed on a top surface SSUS of the support substrate SS. A first opening OP1 overlapping the first region R1 and a second opening OP2 overlapping the second region R2 may be defined in the shield layer BL. The first opening OP1 and the second opening OP2 may expose the top surface SSUS of the support substrate SS.

The shield layer BL may overlap the third region R3. The shield layer BL may overlap the plurality of third regions R3. In an embodiment, the shield layer BL may overlap the fourth region R4. In an embodiment, the shield layer BL may overlap at least a part of the fourth region R4. In this case, the shield layer BL overlapping the third region R3 and the shield layer BL overlapping the fourth region R4 may be spaced apart from each other. That is, the top surface SSUS of the support substrate SS may be exposed along an edge of the third region R3. The following will be described in detail assuming that the shield layer BL entirely covers the third region R3 and the fourth region R4.

The shield layer BL may include a material capable of blocking a laser used in a step of separating a first base layer from the support substrate SS described. In an embodiment, the shield layer BL may include a material having an absorbance of about 90 percent (%) or more (or a transmittance of 10% or less) in a wavelength range of about 300 nanometers (nm). In an embodiment, the shield layer BL may include at least one of amorphous silicon (a-Si), polysilicon (poly-Si), crystalline silicon (crystalline-Si), ZnO, and IZO, for example. In an embodiment, when an excimer laser having a wavelength of about 308 nm is used, it is preferable to use a-Si at a wavelength of about 308 nm.

The shield layer BL may be provided by applying a material for forming the shield layer BL on the support substrate SS and performing patterning through exposure and development using a photoresist.

Referring to FIG. 9, the first base layer 100a may be disposed on the support substrate SS and the shield layer BL. The first base layer 100a may overlap the first region R1, the second region R2, and the third region R3. In an embodiment, the first base layer 100a may overlap the first region R1, the second region R2, the third region R3, and the fourth region R4. The first base layer 100a may fill the first opening OP1 and the second opening OP2.

Figure 10A:
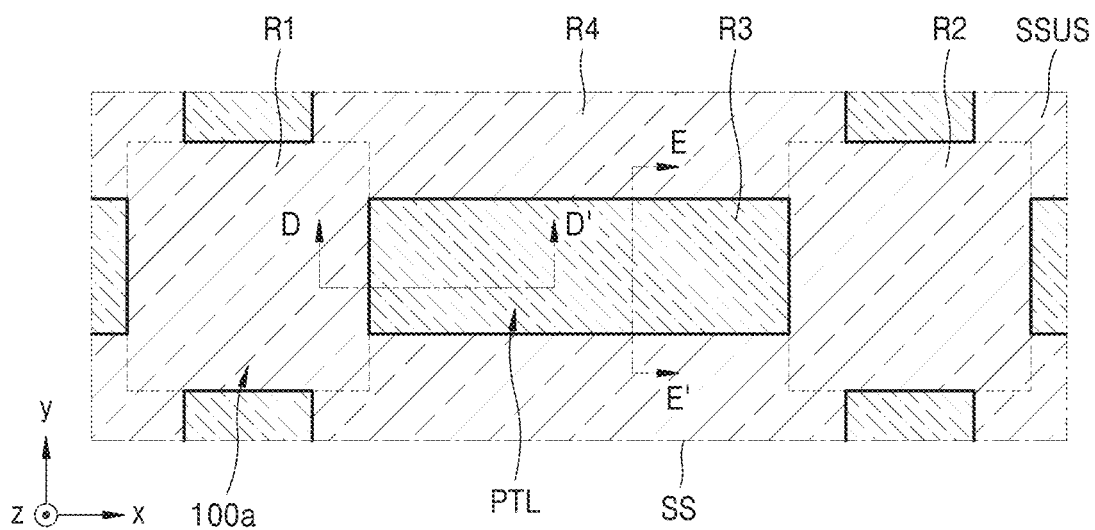
FIGS. 10A through 10C are plan views illustrating embodiments of a method of forming a pattern layer.
Figure 10B:
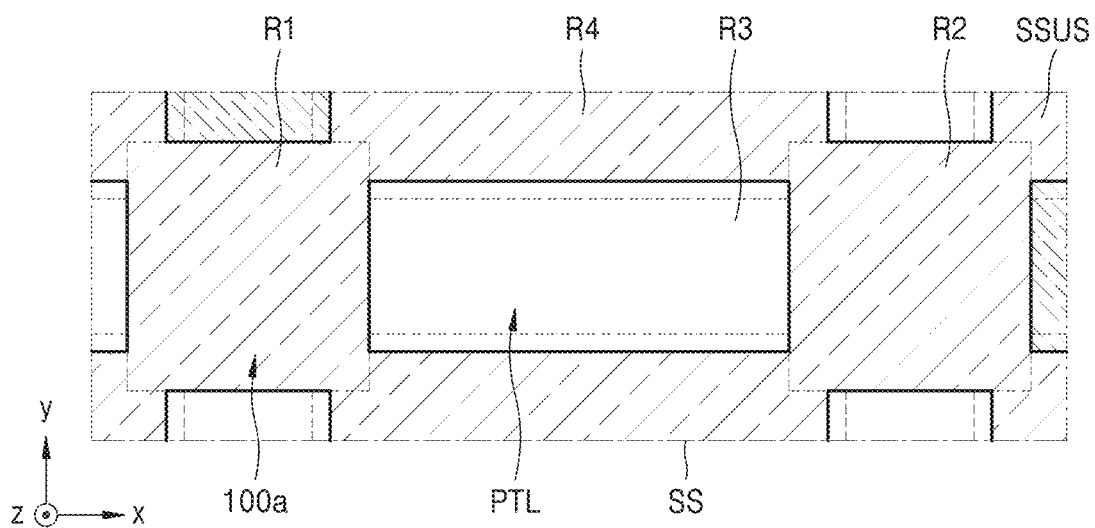
Figure 10C:
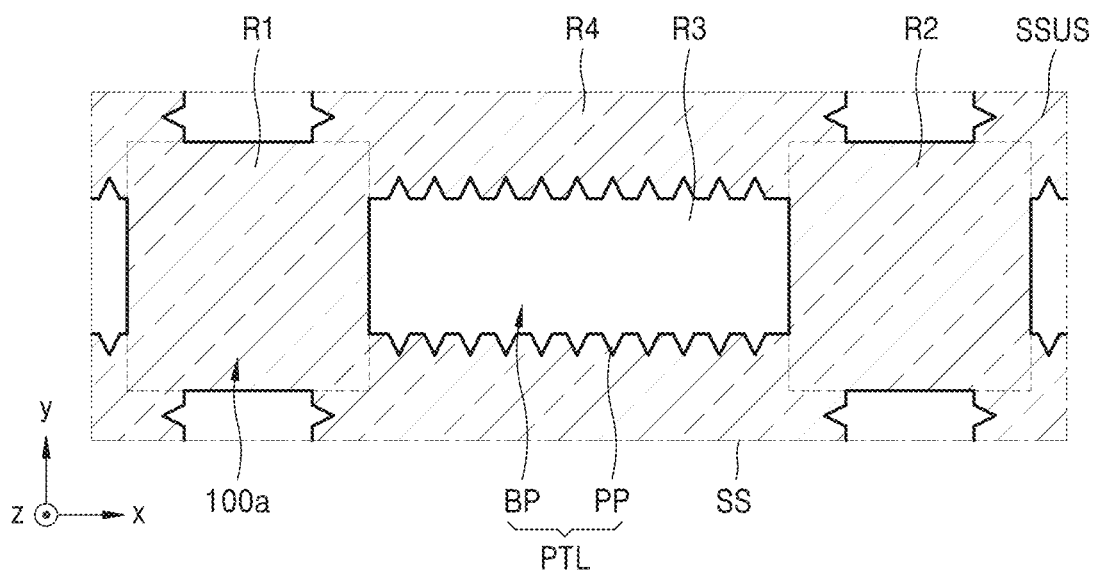

FIGS. 10A through 10C are plan views illustrating embodiments of a method of forming the pattern layer PTL. In FIGS. 10A through 10C, the same members as those in FIGS. 8 and 9 are denoted by the same reference numerals, and thus a repeated description thereof will be omitted.

Referring to FIGS. 10A through 10C, the pattern layer PTL may be disposed on the first base layer 100a to overlap the third region R3. A plurality of pattern layers PTL may respectively overlap a plurality of third regions R3. The pattern layer PTL may be spaced apart from the first region R1 and the second region R2. That is, the pattern layer PTL may not overlap the first region R1 and the second region R2.

In an embodiment, the pattern layer PTL may include graphene oxide. In another embodiment, the pattern layer PTL may include PTFE. In another embodiment, the pattern layer PTL may include graphite. As such, the pattern layer PTL may include a material having low binding energy and/or bond strength with a base layer and a barrier layer. In an embodiment, a modulus of the pattern layer PTL may be equal to or less than a modulus of the barrier layer.

Referring to FIG. 10A, the pattern layer PTL may overlap the third region R3. The pattern layer PTL may be spaced apart from the fourth region R4. That is, the pattern layer PTL may not overlap the fourth region R4.

Referring to FIG. 10B, the pattern layer PTL may overlap the third region R3. Also, the pattern layer PTL may overlap at least a part of the fourth region R4. That is, the pattern layer PTL may extend from the third region R3 to the fourth region R4. The area of the pattern layer PTL may be greater than the area of a connection area of a display panel described below, and the connection area of the display panel described below may be easily detached from the pattern layer PTL.

Referring to FIG. 10C, the pattern layer PTL may include the body portion BP and the protrusion PP. The protrusion PP may protrude from the body portion BP. In a plan view (e.g., a view of a xy plane), the protrusion PP may protrude from the body portion BP. A plurality of protrusions PP may be provided.

Although the plurality of protrusions PP has the same shape in FIG. 10C, in another embodiment, a shape of one of the plurality of protrusions PP may be different from that of another one of the plurality of protrusions PP. Although the plurality of protrusions PP has triangular shapes in FIG. 10C, in another embodiment, the plurality of protrusions PP may have polygonal shapes such as quadrangular shapes or pentagonal shapes, or curved shapes.

In the illustrated embodiment, in order to reduce a thickness of the display panel 10 in the connection area CA, the pattern layer PTL having low binding energy and/or bond strength with any one of elements of the display panel 10 may be provided. Also, the area of the pattern layer PTL may be greater than the area of the connection area of the display panel described below, and the connection area of the display panel described below may be easily detached from the pattern layer PTL.

The following will be described in detail assuming that the pattern layer PTL overlaps the third region R3 as shown in FIG. 10A.

FIGS. 11A through 11E are cross-sectional views illustrating embodiments of a method of forming the pattern layer PTL. FIGS. 11A through 11E may correspond to line D-D' of FIG. 10A. In FIGS. 11A through 11E, the same members as those in FIGS. 10A through 10C are denoted by the same reference numerals, and thus a repeated description thereof will be omitted.

Referring to FIGS. 11A through 11E, the support substrate SS may include a top surface SSUS of the support substrate SS and a bottom surface SSLS of the support substrate SS. The shield layer BL and the first base layer 100a may be disposed on the top surface SSUS of the support substrate SS. The bottom surface SSLS of the support substrate SS may be a surface opposite to the top surface SSUS of the support substrate SS.

In an embodiment, the first base layer 100a overlapping the first region R1 and the first base layer 100a overlapping the third region R3 may be separated from each other. In an embodiment, at least a part of the first base layer 100a disposed at a boundary between the first region R1 and the third region R3 may be removed. In an alternative embodiment, a crack may occur in the first base layer 100a disposed at a boundary between the first region R1 and the third region R3, for example. In this case, only the first base layer 100a overlapping the first region R1 may be easily detached from the support substrate SS. In another embodiment, a process of separating the first base layer 100a overlapping the first region R1 from the first base layer 100a overlapping the third region R3 may be omitted.

The first barrier layer 100b may be disposed on the first base layer 100a. In an embodiment, the first barrier layer 100b may overlap the first region R1 and the third region R3. In an embodiment, the first barrier layer 100b may be continuously disposed in the first region R1 and the third region R3. In another embodiment, the first barrier layer 100b in the first region R1 may be spaced apart from the first barrier layer 100b in the third region R3. In an embodiment, a first barrier pattern 100bP1 may be disposed in the first region R1, and a second barrier pattern 100bP2 may be disposed in the second region R2, for example. The first barrier pattern 100bP1 and the second barrier pattern 100bP2 may be spaced apart from each other.

In an embodiment, the first barrier layer 100b may overlap the first region R1, and may be spaced apart from the third region R3. In an embodiment, referring to FIGS. 11C and 11D, the first barrier layer 100b may be disposed in the first region R1, and the first barrier layer 100b may not be disposed in the third region R3, for example.

The pattern layer PTL may be disposed on the first base layer 100a to overlap the third region R3. The pattern layer PTL may not be disposed in the first region R1. In an embodiment, the pattern layer PTL may be disposed on the first barrier layer 100b. In another embodiment, after the pattern layer PTL is disposed on the first base layer 100a, the first barrier layer 100b may be disposed on the pattern layer PTL.

Figure 11A:
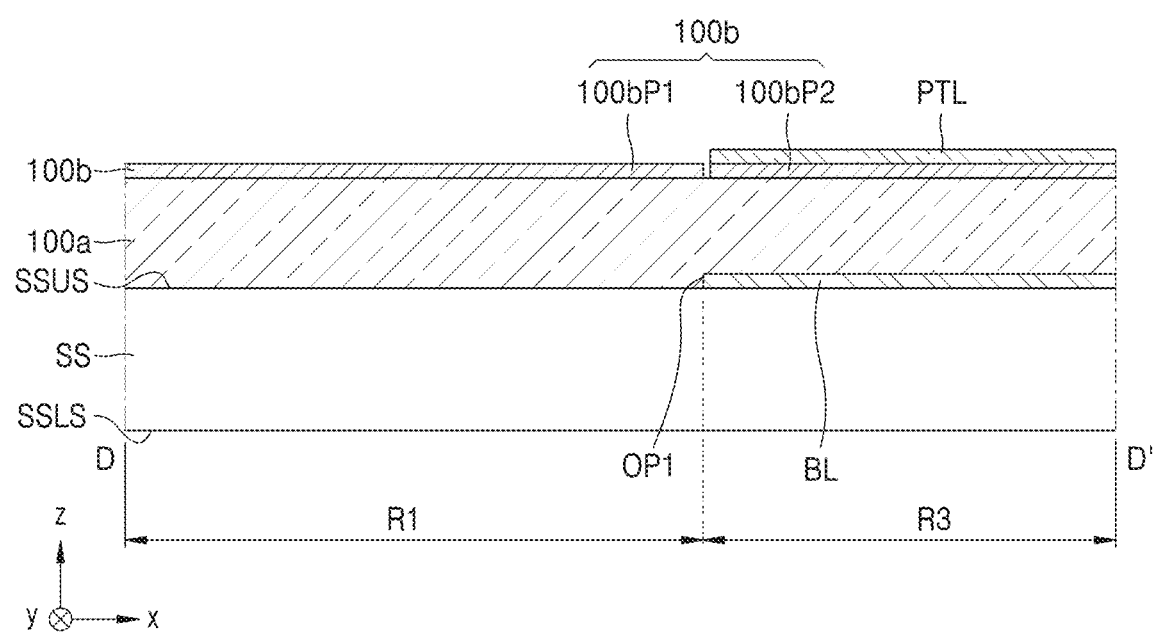
FIGS. 11A through 11E are cross-sectional views illustrating embodiments of a method of forming a pattern layer.
Figure 11B:
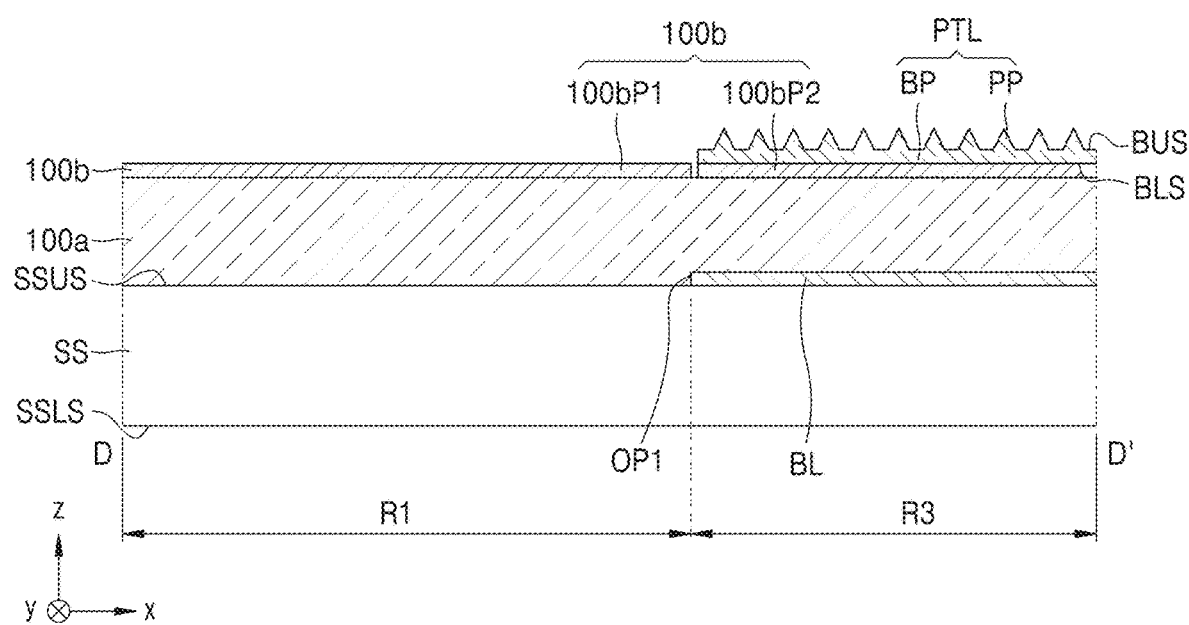
Figure 11C:
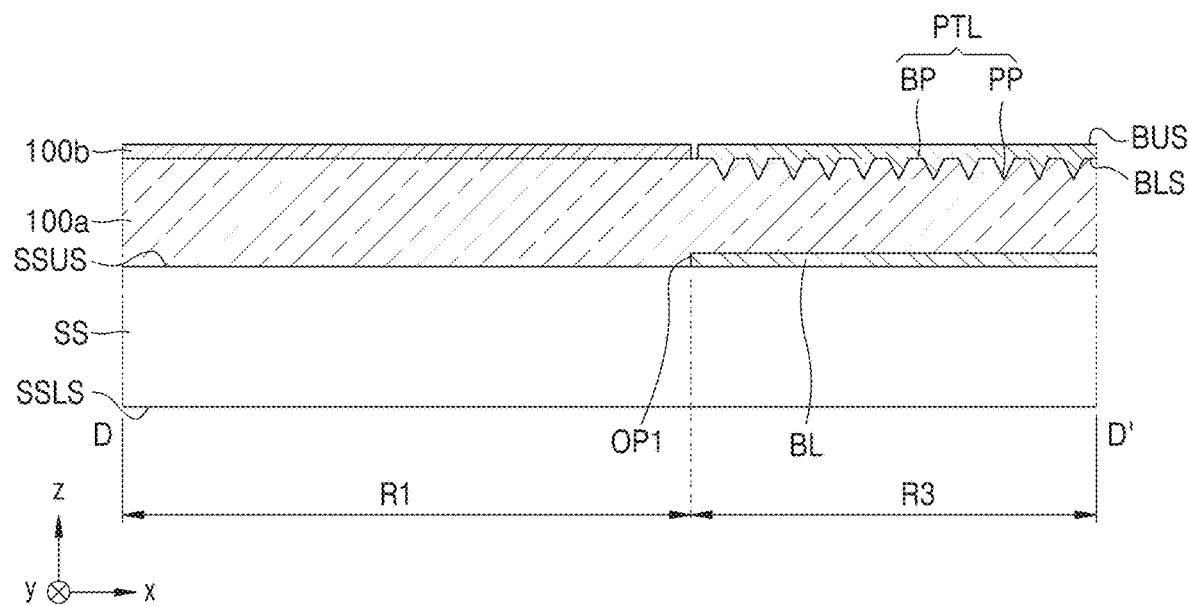
Figure 11D:
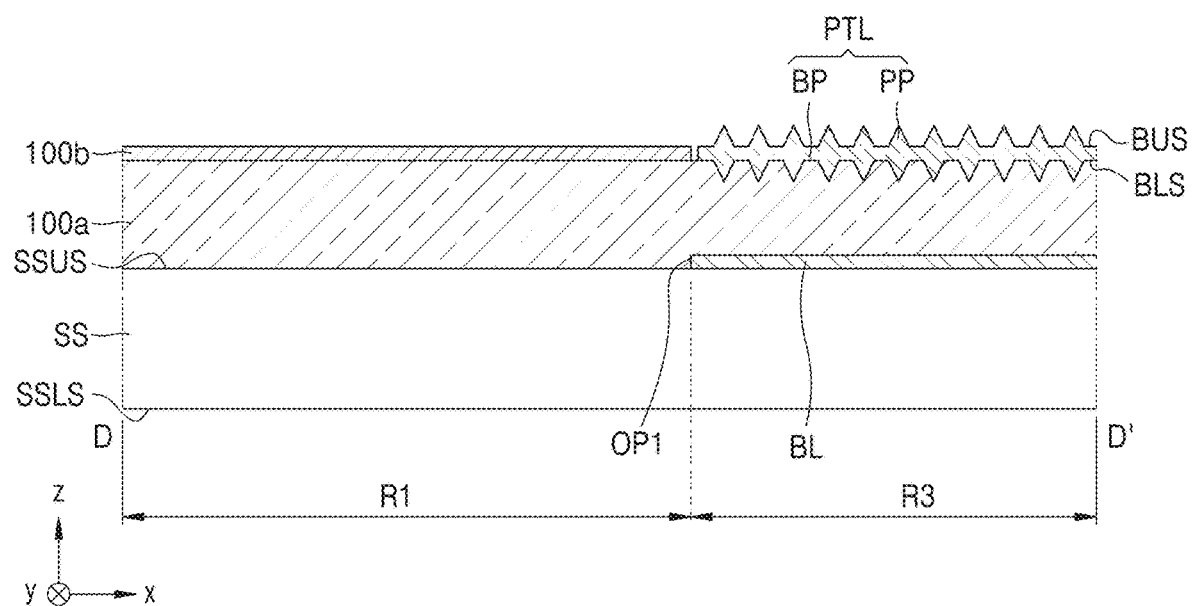

Referring to FIGS. 11B through 11D, the pattern layer PTL may include the body portion BP and the protrusion PP. The protrusion PP may protrude from the body portion BP. In an embodiment, the body portion BP may include a top surface BUS of the body portion BP and a bottom surface BLS of the body portion BP. The bottom surface BLS of the body portion BP may be a surface facing the top surface SSUS of the support substrate SS. The top surface BUS of the body portion BP may be a surface opposite to the bottom surface BLS of the body portion BP.

The protrusion PP may protrude from at least one of the bottom surface BLS of the body portion BP and the top surface BUS of the body portion BP. In an embodiment, a plurality of protrusions PP may protrude from at least one of the bottom surface BLS of the body portion BP and the top surface BUS of the body portion BP.

Although the plurality of protrusions PP has the same shape in FIGS. 11B through 11D, in another embodiment, a shape of one of the plurality of protrusions PP may be different from that of another one of the plurality of protrusions PP. Although the plurality of protrusions PP has triangular shapes in FIGS. 11B through 11D, in another embodiment, the plurality of protrusions PP may have polygonal shapes such as quadrangular shapes or pentagonal shapes, or curved shapes.

Referring to FIG. 11B, the plurality of protrusions PP may protrude from the top surface BUS of the body portion BP.

In this case, a layer disposed on the pattern layer PTL may be easily detached from the pattern layer PTL.

Referring to FIG. 11C, the plurality of protrusions PP may protrude from the bottom surface BLS of the body portion BP. In this case, the pattern layer PTL may be easily detached from a layer disposed under the pattern layer PTL.

Referring to FIG. 11D, the plurality of protrusions PP may protrude from the top surface BUS of the body portion BP and the bottom surface BLS of the body portion BP. In this case, a layer disposed on the pattern layer PTL may be easily detached from the pattern layer PTL. Also, the pattern layer PTL may be easily detached from a layer disposed under the pattern layer PTL.

Figure 11E:
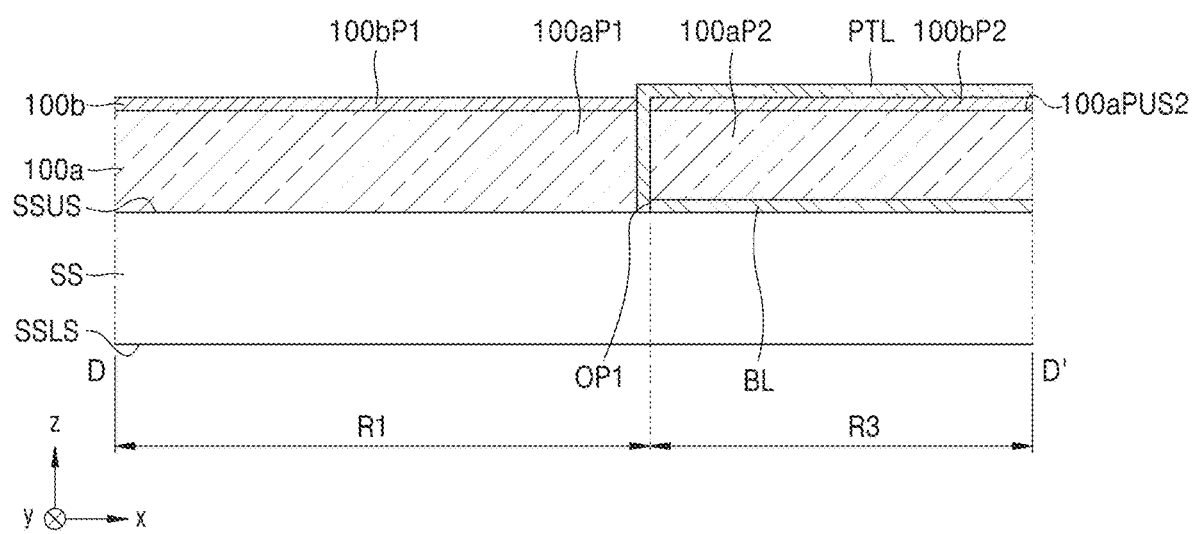

Referring to FIG. 11E, the first base layer 100a may include a first base pattern 100aP1 and a second base pattern 100aP2. The first base pattern 100aP1 may overlap the first region R1. The second base pattern 100aP2 may overlap the third region R3. In an embodiment, the first base pattern 100aP1 and the second base pattern 100aP2 may be spaced apart from each other.

The pattern layer PTL may extend from a top surface 100aPUS2 of the second base pattern 100aP2 to a portion between the first base pattern 100aP1 and the second base pattern 100aP2. Accordingly, the pattern layer PTL may allow the first base pattern 100aP1 and the second base pattern 100aP2 to be spaced apart from each other. In an embodiment, the pattern layer PTL may cover the second base pattern 100aP2 in a shell shape. In an embodiment, the pattern layer PTL may three-dimensionally cover the second base pattern 100aP2. In an embodiment, the pattern layer PTL may allow the first barrier pattern 100bP1 and a second barrier pattern 100bP2 to be spaced apart from each other. Because the first base pattern 100aP1 and the second base pattern 100aP2 are spaced apart from each other, only the first base pattern 100aP1 may be selectively detached from the support substrate SS.

A shape as in FIG. 11E may be provided by the following method. First, after the first base layer 100a is provided, the second base pattern 100aP2 may be provided through patterning. In an embodiment, the second base pattern 100aP2 may have a quadrangular (e.g., rectangular) parallelepiped shape. Next, the pattern layer PTL may cover the second base pattern 100aP2. The pattern layer PTL may entirely cover the second base pattern 100aP2 in a shell shape. Next, the first base pattern 100aP1 may be provided. A shape as shown in FIG. 11E may also be provided by other methods.

The following will be described in detail assuming that the pattern layer PTL overlaps the third region R3 as shown in FIG. 11A.

Figure 12:
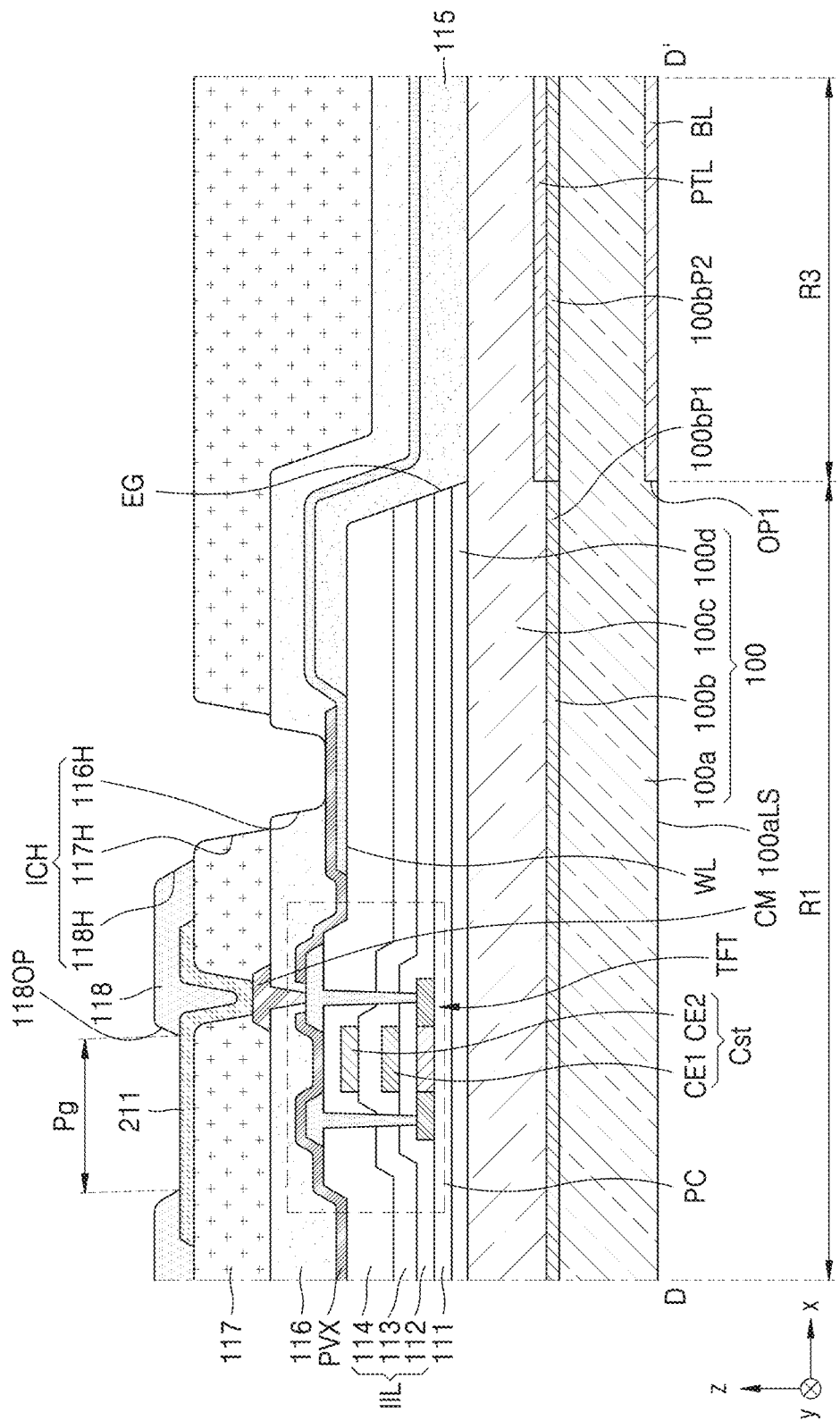
FIG. 12 is a cross-sectional view illustrating an embodiment of a method of manufacturing a display apparatus.

FIG. 12 is a cross-sectional view illustrating an embodiment of a method of manufacturing a display apparatus. FIG. 12 may correspond to line D-D' of FIG. 10A. In FIG. 12, the same members as those in FIG. 11A are denoted by the same reference numerals, and thus a detailed description thereof will be omitted.

Referring to FIG. 12, the second base layer 100c may be disposed on the first barrier layer 100b and the pattern layer PTL. The second base layer 100c may entirely cover the first barrier layer 100b and the pattern layer PTL.

Next, the second barrier layer 100d may be provided. In an embodiment, the second barrier layer 100d may be entirely disposed in the first region R1 and the third region R3. In an embodiment, the second barrier layer 100d may overlap the first region R1, and may be spaced apart from the third region R3.

Next, the inorganic insulating layer IIL may be provided. The inorganic insulating layer IIL may include the first gate insulating layer 112, the second gate insulating layer 113, and the inter-insulating layer 114. Also, the pixel circuit PC including the storage capacitor Cst and the thin-film transistor TFT may be provided. Also, the wiring WL may be provided.

The end portions EG of the second barrier layer 100d, the buffer layer 111, and the inorganic insulating layer IIL may be provided. In an embodiment, the second barrier layer 100d, the buffer layer 111, and the inorganic insulating layer IIL overlapping the third region R3 may be removed by an etching process. Although an end portion of the second barrier layer 100d, an end portion of the buffer layer 111, and an end portion of the inorganic insulating layer IIL are matched in FIG. 12, in another embodiment, the end portion of the second barrier layer 100d, the end portion of the buffer layer 111, and the end portion of the inorganic insulating layer IIL may not be matched. That is, the end portion of the second barrier layer 100d, the end portion of the buffer layer 111, and the end portion of the inorganic insulating layer IIL may have a stepped portion.

The lower organic insulating layer 115 may be disposed in the first region R1 and the third region R3. The lower organic insulating layer 115 may cover the end portions EG of the second barrier layer 100d, the buffer layer 111, and the inorganic insulating layer IIL.

The inorganic protective layer PVX may cover the wiring WL.

Next, the first organic insulating layer 116 may be provided, and the connection electrode CM may be provided.

Next, the second organic insulating layer 117 may be provided, and the pixel electrode 211 of the organic light-emitting diode may be provided as a display element. The pixel electrode 211 may be disposed in the first region R1. Also, although not shown in FIG. 12, the pixel electrode 211 may also be disposed in a second region. That is, the pixel electrode 211 may be disposed on the first base layer 100a to overlap at least one of the first region R1 and the second region.

Next, the pixel-defining film 118 may expose a central portion of the pixel electrode 211 and cover an edge of the pixel electrode 211.

An inorganic contact hole ICH may expose at least a part of the inorganic protective layer PVX. The inorganic contact hole ICH may be defined by connecting the first hole 116H of the first organic insulating layer 116, the second hole 117H of the second organic insulating layer 117, and the third hole 118H of the pixel-defining film 118. Accordingly, a stepped portion may be provided on an inner surface of the inorganic contact hole ICH.

Figure 13A:
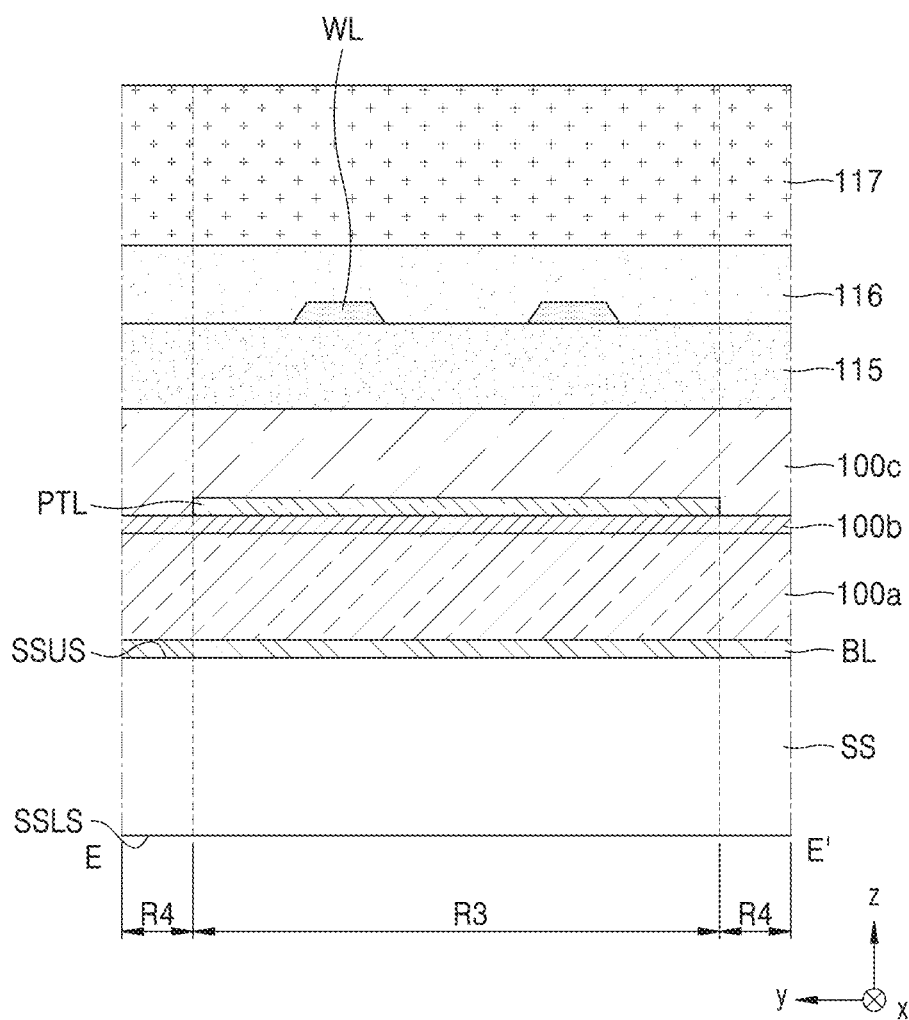
FIGS. 13A and 13B are cross-sectional views illustrating an embodiment of a method of manufacturing a display apparatus.
Figure 13B:
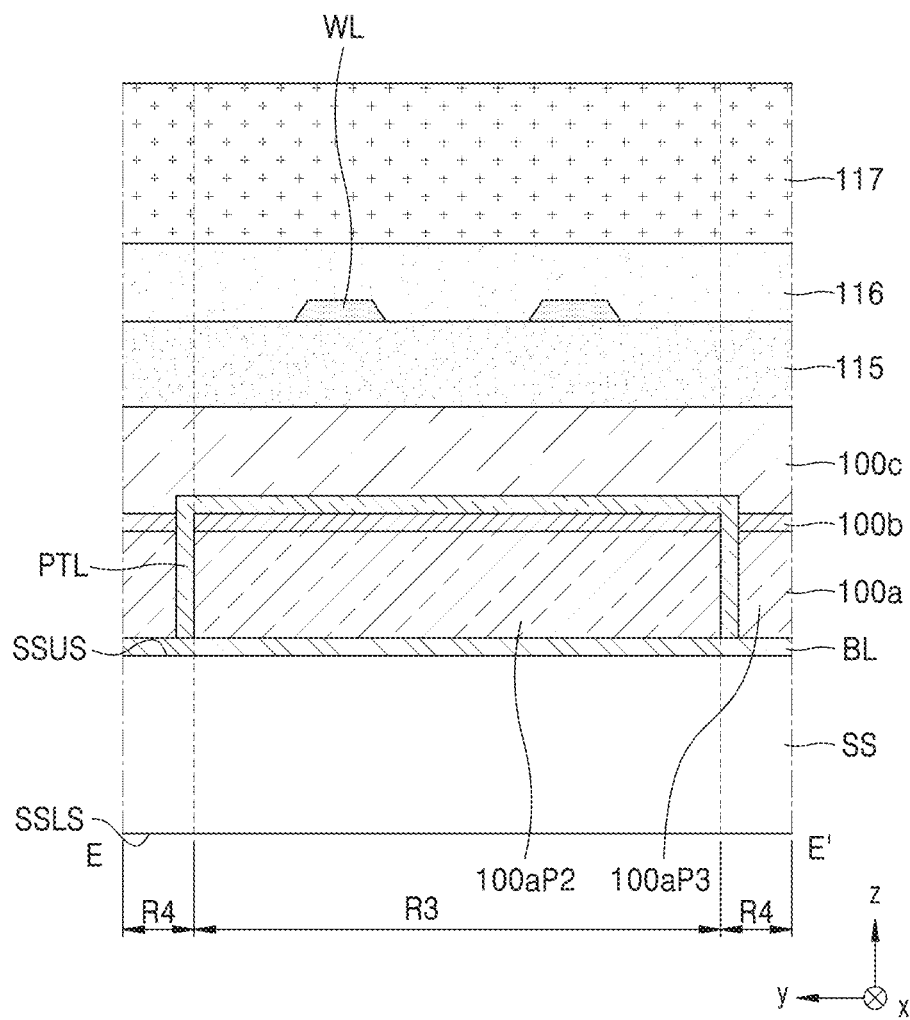

FIGS. 13A and 13B are cross-sectional views illustrating an embodiment of a method of manufacturing a display apparatus. FIGS. 13A and 13B may correspond to line E-E' of FIG. 10A. In FIGS. 13A and 13B, the same members as those in FIG. 12 are denoted by the same reference numerals, and thus a repeated description thereof will be omitted.

Referring to FIGS. 13A and 13B, the support substrate SS may include the top surface SSUS of the support substrate SS and the bottom surface SSLS of the support substrate SS. The shield layer BL and the first base layer 100a may be disposed on the top surface SSUS of the support substrate SS. The shield layer BL and the first base layer 100a may overlap the third region R3 and the fourth region R4.

The first barrier layer 100b may be disposed on the first base layer 100a. In an embodiment, the first barrier layer 100b may overlap the third region R3 and the fourth region R4. In some embodiments, the first barrier layer 100b may be omitted.

The pattern layer PTL may be disposed on the first base layer 100a to overlap the third region R3. In an embodiment, the pattern layer PTL may be disposed on the first barrier layer 100b. In another embodiment, after the pattern layer PTL is disposed on the first base layer 100a, the first barrier layer 100b may be disposed on the pattern layer PTL.

Referring to FIG. 13A, the first base layer 100a may be continuously disposed in the third region R3 and the fourth region R4, and the pattern layer PTL may be disposed on the first base layer 100a.

Referring to FIG. 13B, the first base layer 100a may include the second base pattern 100aP2 and a third base pattern 100aP3. The second base pattern 100aP2 may overlap the third region R3. The third base pattern 100aP3 may overlap the fourth region R4. The second base pattern 100aP2 and the third base pattern 100aP3 may be spaced apart from each other.

The pattern layer PTL may extend from a top surface of the second base pattern 100aP2 to a portion between the second base pattern 100aP2 and the third base pattern 100aP3. The pattern layer PTL may allow the second base pattern 100aP2 and the third base pattern 100aP3 to be spaced apart from each other. In an embodiment, the pattern layer PTL may cover the second base pattern 100aP2 in a shell shape. In an embodiment, the pattern layer PTL may three-dimensionally cover the second base pattern 100aP2.

The following will be described in detail assuming that the first base layer 100a is continuously disposed in the third region R3 and the fourth region R4 as shown in FIG. 13A, and the pattern layer PTL is disposed on the first base layer 100a.

Next, the second base layer 100c may be disposed on the pattern layer PTL and the first barrier layer 100b, and the lower organic insulating layer 115 may be disposed on the second base layer 100c.

Next, the wiring WL may be disposed on the lower organic insulating layer 115, and the first organic insulating layer 116 and the second organic insulating layer 117 may be sequentially disposed on the wiring WL.

FIGS. 14A through 14D are plan views illustrating embodiments of a method of removing at least a part of the second base layer 100c. In FIGS. 14A through 14D, the same members as those in FIGS. 10A through 10C are denoted by the same reference numerals, and thus a repeated description thereof will be omitted.

Referring to FIGS. 14A through 14D, at least a part of the second base layer 100c may be removed. In an embodiment, at least a part of the second base layer 100c overlapping the fourth region R4 may be removed. In an embodiment, a part of the second base layer 100c may be removed along an edge of the fourth region R4, for example. Accordingly, the second base layer 100c overlapping the first region R1, the second region R2, and the third region R3 may be separated from the second base layer 100c overlapping the fourth region R4. In another embodiment, the second base layer 100c overlapping the fourth region R4 may be removed. In this case, the second base layer 100c overlapping the first region R1, the second region R2, and the third region R3 may remain, and the second base layer 100c overlapping the fourth region R4 may be entirely removed.

Figure 14A:
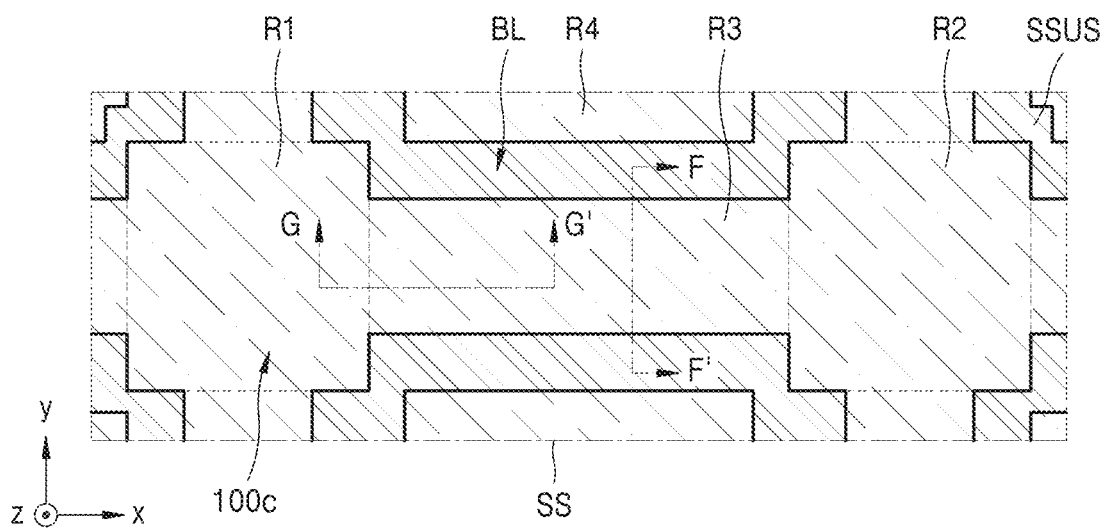
FIGS. 14A through 14D are plan views illustrating embodiments of a method of removing at least a part of a second base layer.
Figure 14B:
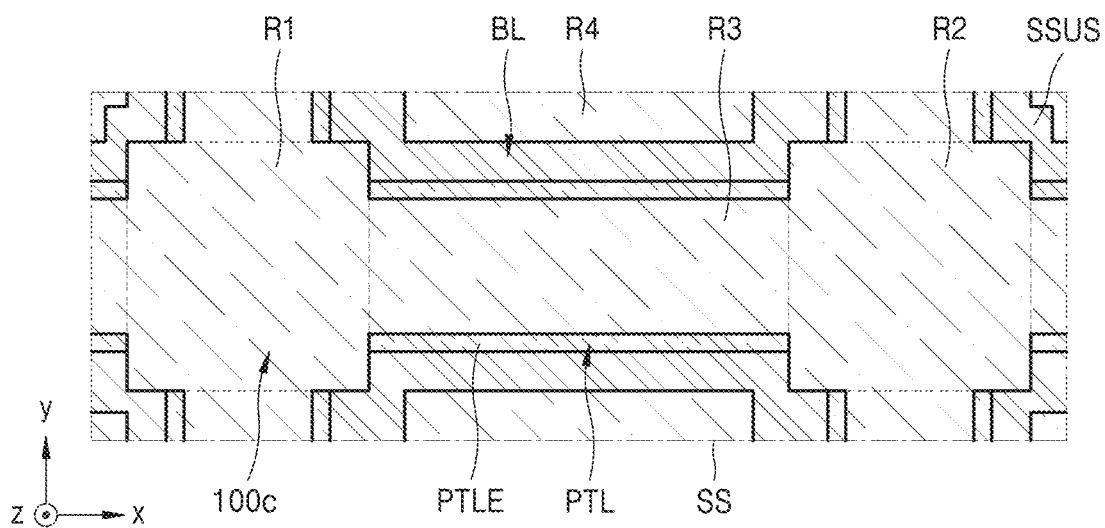
Figure 14C:
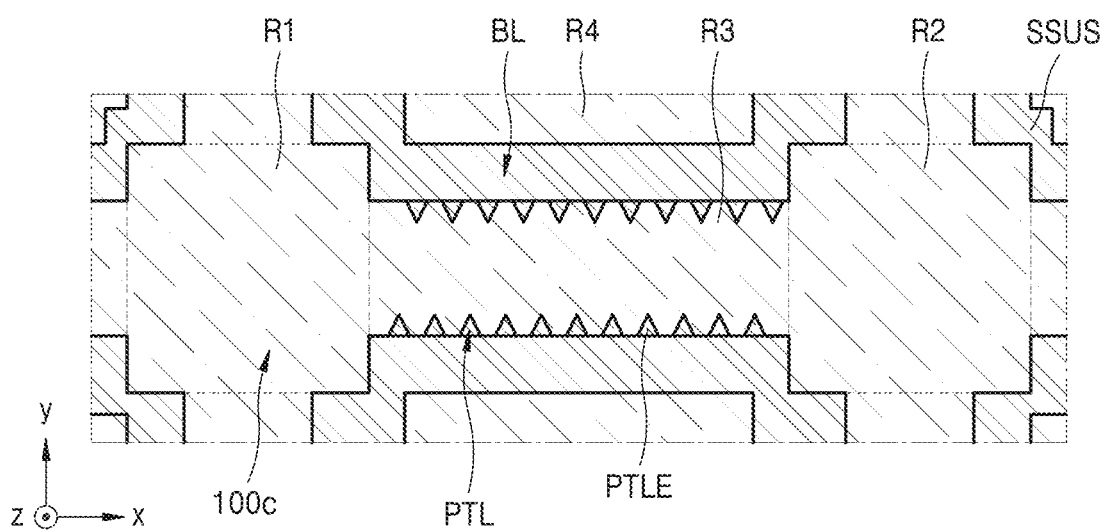
Figure 14D:
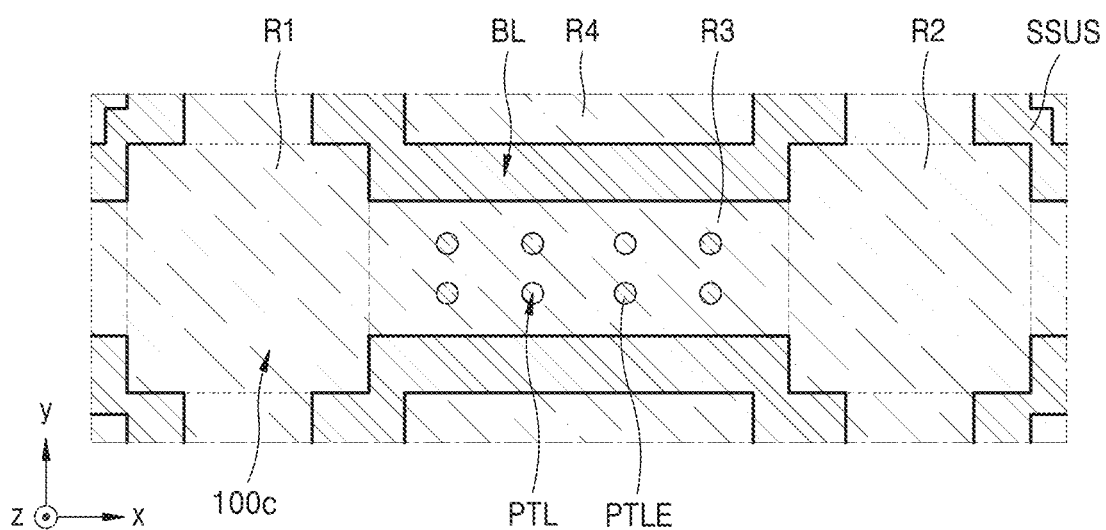

Referring to FIGS. 14B through 14D, at least a part of the second base layer 100c may be removed to expose at least a part of the pattern layer PTL. Accordingly, the area of the second base layer 100c overlapping the pattern layer PTL in the third region R3 may be less than the area of the pattern layer PTL in the third region R3. Accordingly, the second base layer 100c may be easily detached from the pattern layer PTL.

Referring to FIG. 14B, the pattern layer PTL may overlap at least parts of the third region R3 and the fourth region R4. The pattern layer PTL may extend from the third region R3 to the fourth region R4. The pattern layer PTL may include an exposed portion PTLE. The exposed portion PTLE may be defined as a portion of a top surface of the pattern layer PTL not overlapping the second base layer 100c. In an embodiment, the exposed portion PTLE may overlap the fourth region R4. The exposed portion PTLE may continuously extend in the first direction (e.g., the x direction or the −x direction).

Referring to FIG. 14C, at least a part of the second base layer 100c overlapping the third region R3 may be removed to expose at least a part of the pattern layer PTL. A plurality of exposed portions PTLE may be provided, and may be spaced apart from one another. Also, the exposed portions PTLE may be disposed at an edge of the pattern layer PTL. Although the plurality of exposed portion PTLE has the same shape in FIG. 14C, in another embodiment, a shape of one of the plurality of exposed portions PTLE may be different from that of another one of the plurality of exposed portions PTLE. Although the plurality of exposed portions PTLE has triangular shapes in FIG. 14C, in another embodiment, the plurality of exposed portions PTLE may have polygonal shapes such as quadrangular shapes or pentagonal shapes, or curved shapes.

Referring to FIG. 14D, at least a part of the second base layer 100c overlapping the third region R3 may be removed to expose at least a part of the pattern layer PTL. A plurality of exposed portions PTLE may be provided, and may be spaced apart from one another. The exposed portions PTLE may be disposed inside the pattern layer PTL. That is, the exposed portions PTLE may be disposed inside the third region R3. Although the plurality of exposed portions PTLE has the same shape in FIG. 14D, in another embodiment, a shape of one of the plurality of exposed portions PTLE may be different from that of another one of the plurality of exposed portions PTLE. Although the plurality of exposed portions PTLE has circular shapes in FIG. 14D, in another embodiment, the plurality of exposed portions PTLE may have polygonal shapes such as quadrangular shapes or pentagonal shapes, or elliptical shapes.

The following will be described in detail assuming that the pattern layer is matched to the third region R3 as shown in FIG. 14A.

FIGS. 15A through 15E are plan views illustrating embodiments of a method of removing at least a part of the second base layer 100c. FIGS. 15A through 15E may correspond to line F-F' of FIG. 14A. In FIGS. 15A through 15E, the same members as those in FIGS. 14A through 14D are denoted by the same reference numerals, and thus a repeated description thereof will be omitted.

Referring to FIGS. 15A through 15E, at least a part of the second base layer 100c may be removed. In an embodiment, at least a part of the second base layer 100c overlapping the fourth region R4 may be removed. In an embodiment, at least one of the first base layer 100a, the first barrier layer 100b, the second base layer 100c, the lower organic insulating layer 115, the first organic insulating layer 116, and the second organic insulating layer 117 overlapping the fourth region R4 may be removed. In an embodiment, the first base layer 100a, the first barrier layer 100b, the second base layer 100c, the lower organic insulating layer 115, the first organic insulating layer 116, and the second organic insulating layer 117 overlapping the fourth region R4 may be removed, for example.

Figure 15A:
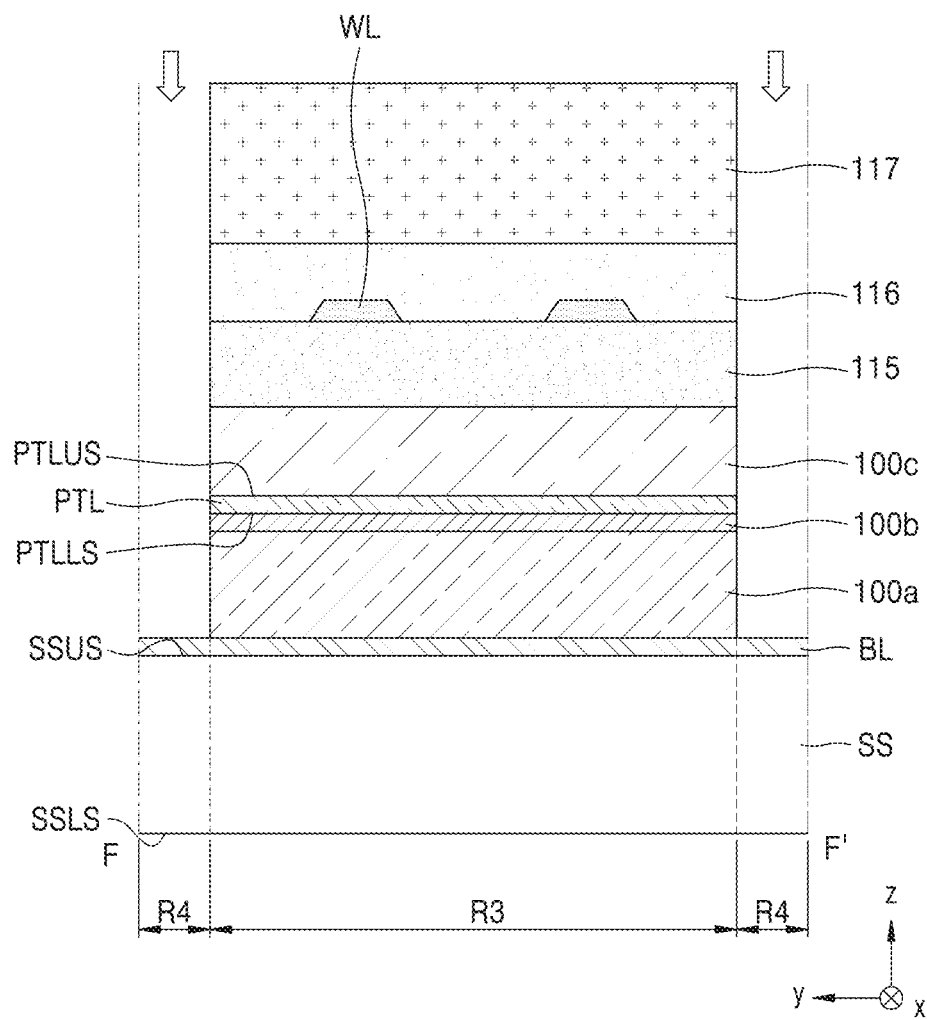
FIGS. 15A through 15E are plan views illustrating embodiments of a method of removing at least a part of a second base layer.

Referring to FIG. 15A, the second base layer 100c may entirely cover a top surface PTLUS of the pattern layer PTL. The pattern layer PTL may include the top surface PTLUS of the pattern layer PTL and a bottom surface PTLLS of the pattern layer PTL. The bottom surface PTLLS of the pattern layer PTL may be a surface facing the top surface SSUS of the support substrate SS. The top surface PTLUS of the pattern layer PTL may be a surface opposite to the bottom surface PTLLS of the pattern layer PTL.

Referring to FIGS. 15B through 15E, at least a part of the second base layer 100c may be removed to expose at least a part of the top surface PTLUS of the pattern layer PTL. Accordingly, the area of the top surface PTLUS of the pattern layer PTL may be greater than the area of a bottom surface of the second base layer 100c, and the second base layer 100c may be easily detached from the pattern layer PTL.

Figure 15B:
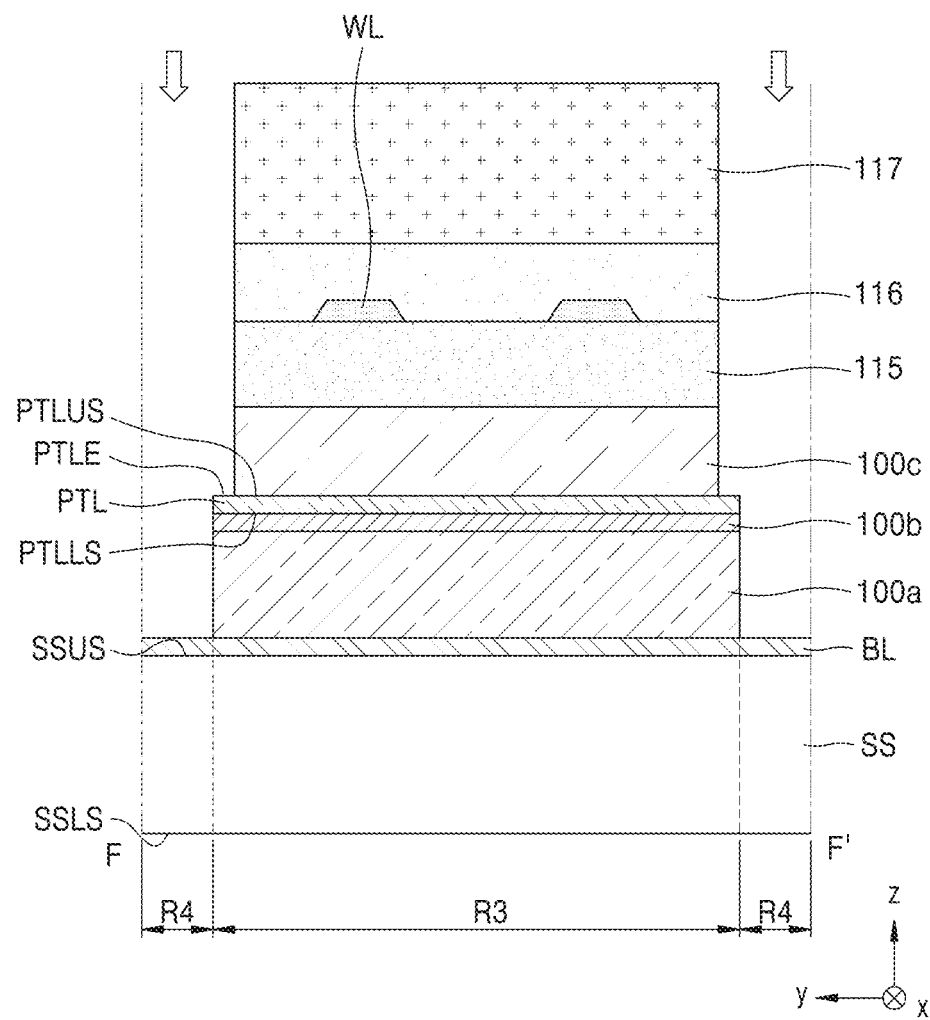

Referring to FIG. 15B, a part of the top surface PTLUS of the pattern layer PTL may be exposed. The top surface PTLUS of the pattern layer PTL may include the exposed portion PTLE. The exposed portion PTLE may be a surface not overlapping the second base layer 100c. In FIG. 15B, the exposed portion PTLE may be an edge of the top surface PTLUS of the pattern layer PTL.

Figure 15C:
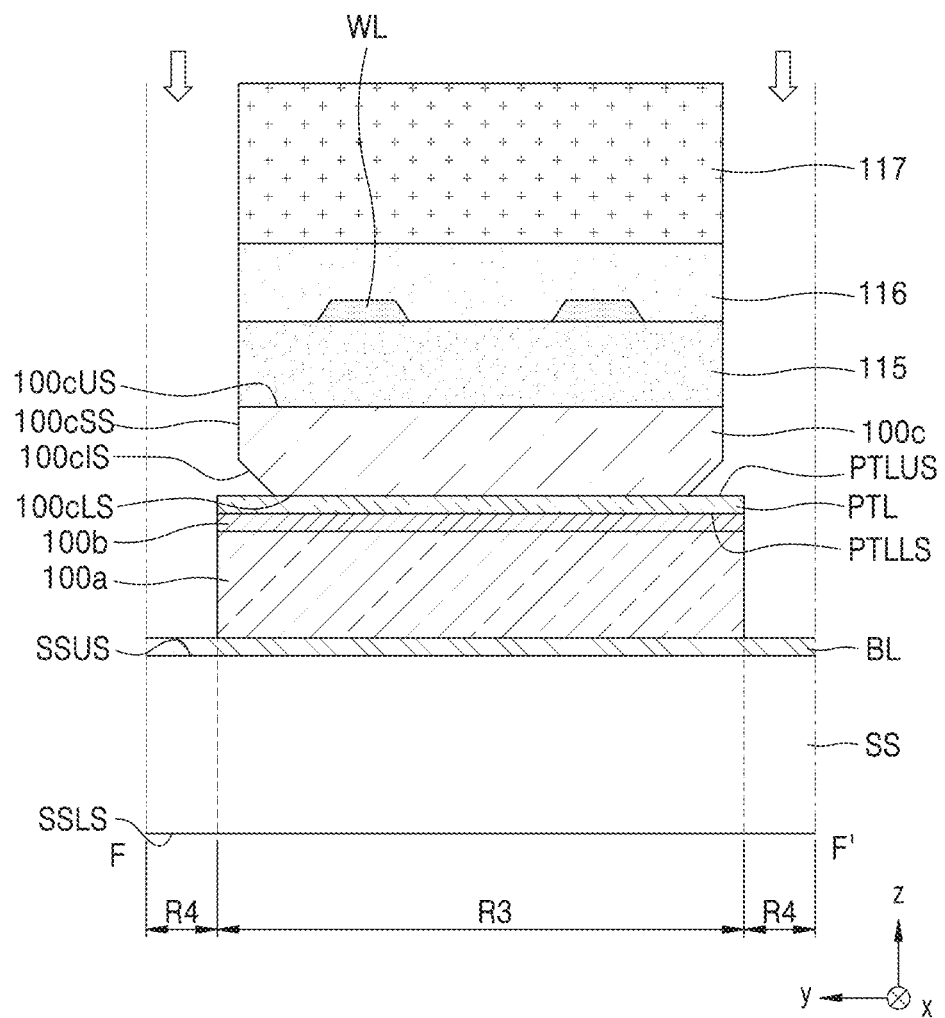

Referring to FIG. 15C, at least a part of the second base layer 100c may be removed to expose at least a part of the top surface PTLUS of the pattern layer PTL. The second base layer 100c may include the bottom surface 100cLS of the second base layer 100c, the top surface 100cUS of the second base layer 100c, the side surface 100cSS of the second base layer 100c, and the inclined surface 100cIS of the second base layer 100c. The top surface 100cUS of the second base layer 100c may be a surface facing the wiring WL. The bottom surface 100cLS of the second base layer 100c may be a surface opposite to the top surface 100cUS of the second base layer 100c.

The inclined surface 100cIS of the second base layer 100c may be inclined. In an embodiment, the inclined surface 100cIS of the second base layer 100c may meet the bottom surface 100cLS of the second base layer 100c. A side of the inclined surface 100cIS of the second base layer 100c may meet the bottom surface 100cLS of the second base layer 100c, and the other side of the inclined surface 100cIS of the second base layer 100c may meet the side surface 100cSS of the second base layer 100c. The Inclined surface 100cIS of the second base layer 100c may intersect the side surface 100cSS of the second base layer 100c. Accordingly, at least a part of the top surface PTLUS of the pattern layer PTL may be exposed through the inclined surface 100cIS of the second base layer 100c.

The side surface 100cSS of the second base layer 100c may meet the inclined surface 100cIS of the second base layer 100c and the top surface 100cUS of the second base layer 100c. The side surface 100cSS of the second base layer 100c may intersect the top surface 100cUS of the second base layer 100c.

Figure 15D:
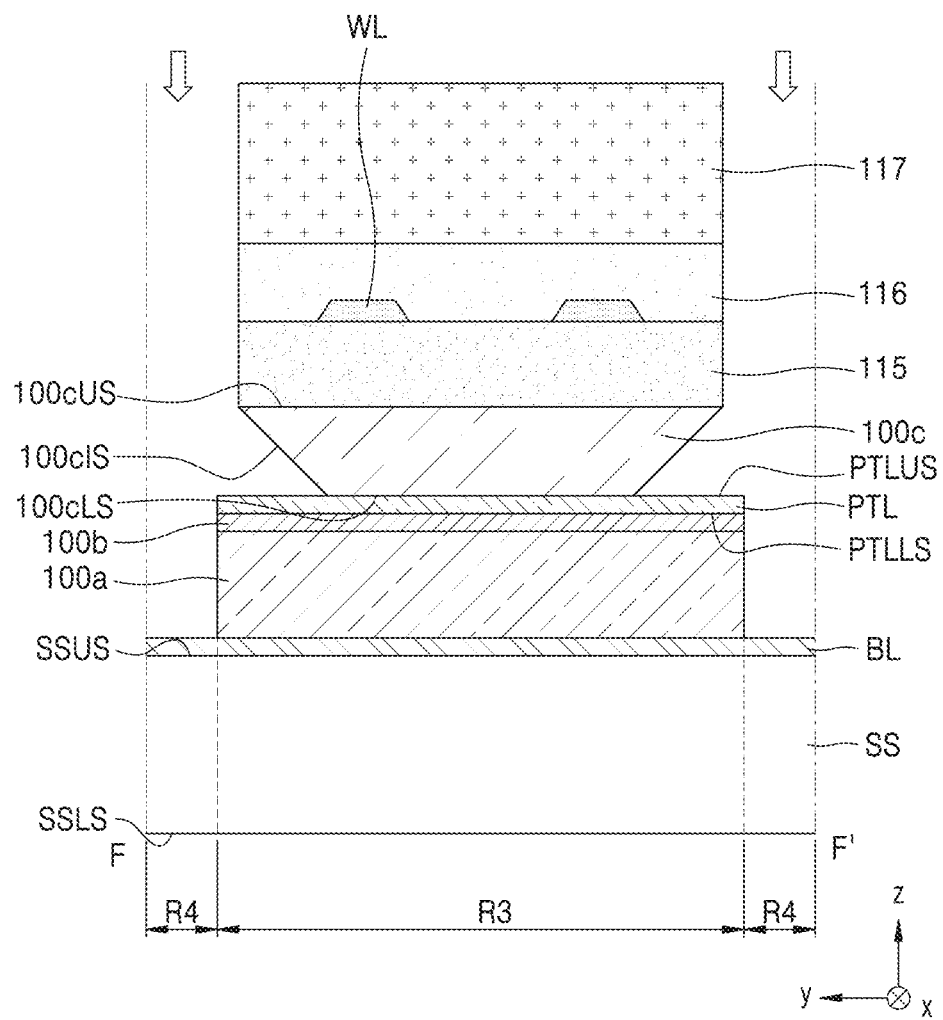

Referring to FIG. 15D, at least a part of the second base layer 100c may be removed to expose at least a part of the top surface PTLUS of the pattern layer PTL. The second base layer 100c may include the bottom surface 100cLS of the second base layer 100c, the top surface 100cUS of the second base layer 100c, and the inclined surface 100cIS of the second base layer 100c. The top surface 100cUS of the second base layer 100c may be a surface facing the wiring WL. The bottom surface 100cLS of the second base layer 100c may be a surface opposite to the top surface 100cUS of the second base layer 100c.

The inclined surface 100cIS of the second base layer 100c may be inclined. In an embodiment, the inclined surface 100cIS of the second base layer 100c may meet the bottom surface 100cLS of the second base layer 100c. A side of the inclined surface 100cIS of the second base layer 100c may meet the bottom surface 100cLS of the second base layer 100c, and the other side of the inclined surface 100cIS of the second base layer 100c may meet the top surface 100cUS of the second base layer 100c. Accordingly, at least a part of the top surface PTLUS of the pattern layer PTL may be exposed through the inclined surface 100cIS of the second base layer 100c.

In some embodiments, a width of the pattern layer PTL may be the same as a width of the bottom surface of the second base layer 100c, and the pattern layer PTL may not be exposed. In this case, at least a part of a top surface of the first base layer 100a may not overlap the pattern layer PTL, and the pattern layer PTL may be easily detached from the first barrier layer 100b and/or the first base layer 100a.

Figure 15E:
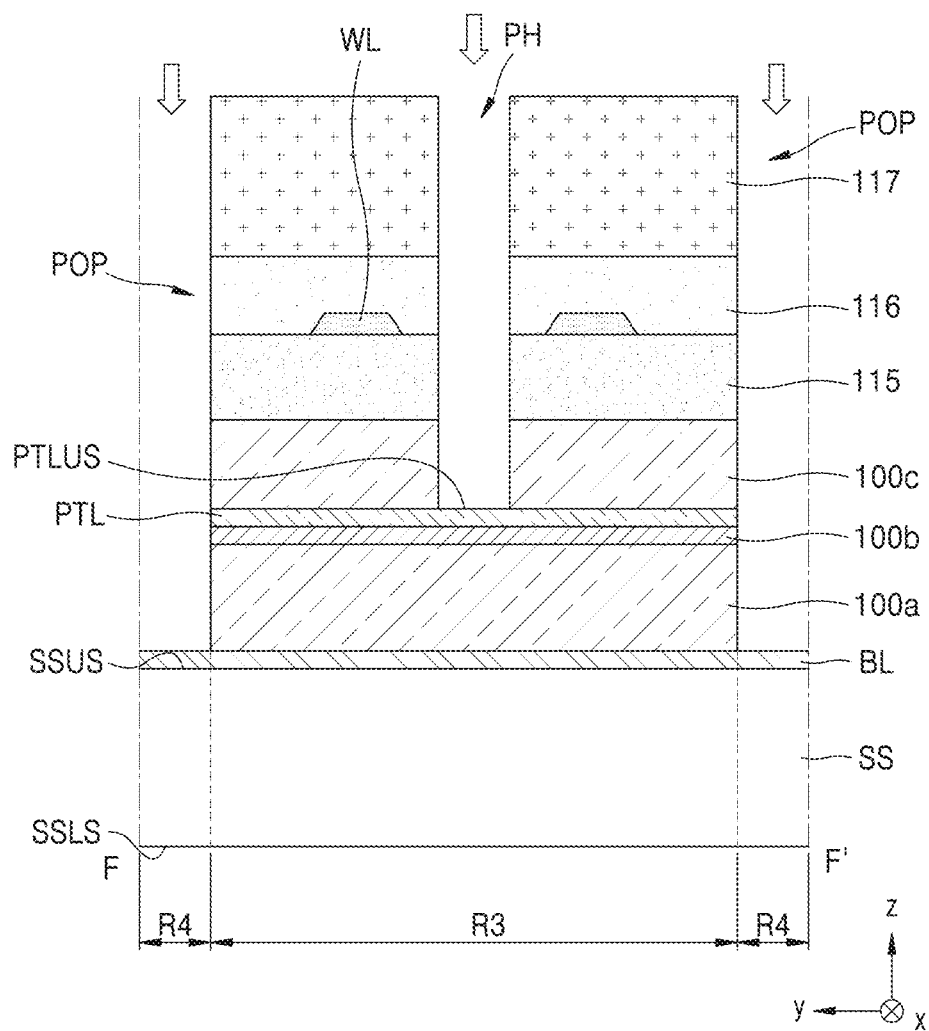

Referring to FIG. 15E, at least a part of the second base layer 100c may be removed to expose at least a part of the top surface PTLUS of the pattern layer PTL. The through-hole PH may be defined in the second base layer 100c, the lower organic insulating layer 115, the first organic insulating layer 116, and the second organic insulating layer 117. The through-hole PH may be spaced apart from the through-opening POP. The through-hole PH may expose at least a part of the top surface PTLUS of the pattern layer PTL.

Figure 16:
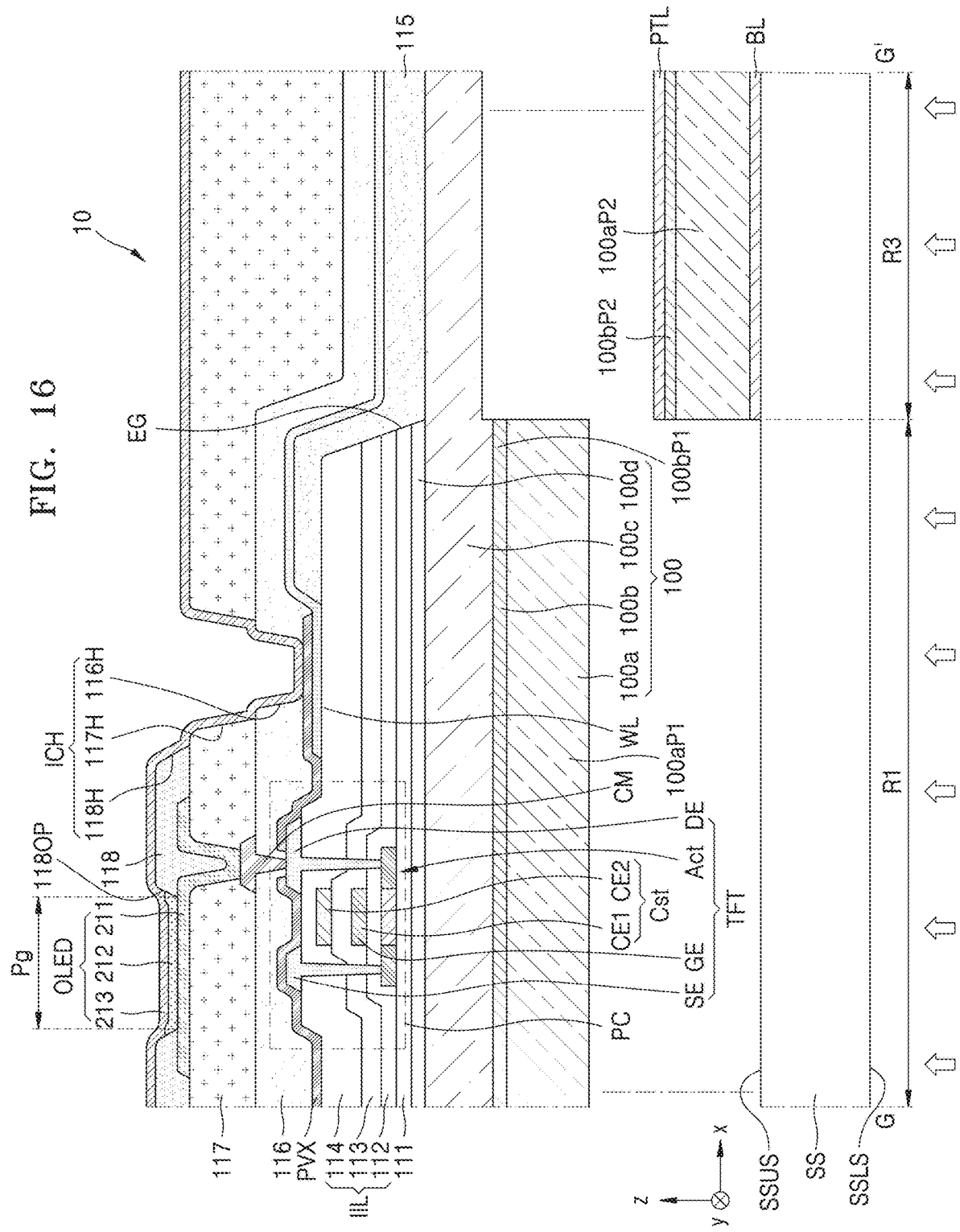
FIG. 16 is a cross-sectional view illustrating an embodiment of a method of manufacturing a display apparatus.

FIG. 16 is a cross-sectional view illustrating an embodiment of a method of manufacturing a display apparatus. FIG. 16 may correspond to line G-G' of FIG. 14A. In FIG. 16, the same members as those in FIG. 12 are denoted by the same reference numerals, and thus a repeated description thereof will be omitted.

Referring to FIG. 16, the intermediate layer 212 and the counter electrode 213 may be disposed on the pixel electrode 211. Accordingly, the organic light-emitting diode OLED may be provided as a display element. In an embodiment, the counter electrode 213 may be entirely disposed over the first region R1 and the third region R3. The counter electrode 213 may be disposed in the inorganic contact hole ICH. Accordingly, the counter electrode 213 may contact the inorganic protective layer PVX exposed through the inorganic contact hole ICH.

Next, the first base layer 100a overlapping the first region R1 and the first base layer 100a overlapping the third region R3 may be separated from each other. That is, the first base pattern 100aP1 of the first base layer 100a overlapping the first region R1 and the second base pattern 100aP2 of the first base layer 100a overlapping the third region R3 may be separated from each other.

In an embodiment, the first base layer 100a overlapping the first region R1 may be separated from the support substrate SS according to a laser release method of irradiating a laser to the substrate 100. The laser may be irradiated in a direction from the bottom surface SSLS of the support substrate SS to the top surface SSUS of the support substrate SS. Accordingly, the laser may be irradiated to a bottom surface of the substrate 100 facing the top surface SSUS of the support substrate SS. In an embodiment, the laser may be, for example, an excimer laser with a wavelength of about 308 nm, or a solid-state ultra-violet ("UV") laser with a wavelength of about 343 nm or about 355 nm.

Because the shield layer BL is disposed in the third region R3, the laser may be absorbed. Even when the laser is irradiated, the first base layer 100a overlapping the third region R3 may not be detached from the support substrate SS. Accordingly, the first base layer 100a overlapping the first region R1 may be detached from the support substrate SS, and the first base layer 100a overlapping the third region R3 may remain on the support substrate SS.

The second base layer 100c overlapping the third region R3 may be detached from the first base layer 100a overlapping the third region R3. The pattern layer PTL may be disposed between the first base layer 100a and the second base layer 100c. Because the pattern layer PTL includes a material having low binding energy and/or bond strength with a base layer and a barrier layer, even when the laser is not directly irradiated, the first base layer 100a overlapping the third region R3 and the second base layer 100c overlapping the third region R3 may be separated from each other.

The pattern layer PTL may be detached from any one of the first base layer 100a and the second base layer 100c. In an embodiment, the pattern layer PTL may remain on the support substrate SS. In this case, the pattern layer PTL may remain on the first base layer 100a and/or the second barrier pattern 100bP2 disposed in the third region R3, and the pattern layer PTL may be separated from the second base layer 100c disposed in the third region R3. In another embodiment, the pattern layer PTL may be detached from the support substrate SS. In this case, the pattern layer PTL may be detached from the first base layer 100a or the second barrier pattern 100bP2 disposed in the third region R3, and may remain on a bottom surface of the second base layer 100c overlapping the third region R3. In another embodiment, a first pattern and a second pattern of the pattern layer PTL may be separated. In this case, the first pattern may remain on the first base layer 100a and/or the second barrier pattern 100bP2 disposed in the third region R3, and the second pattern may remain on the bottom surface of the second base layer 100c overlapping the third region R3.

Next, a cover window (not shown) may be attached to the display panel 10.

As described above, the first base layer 100a overlapping the third region R3 may remain on the support substrate SS, and the second base layer 100c overlapping the third region R3 may be detached from the support substrate SS. Accordingly, a thickness of the display panel 10 in a connection area of the display panel 10 may be less than a thickness of the display panel 10 in a pixel area of the display panel 10, and the flexibility of the display panel 10 may be improved.

In an embodiment, a thickness of a display panel in a connection area may be less than a thickness of the display panel in a first pixel area, thereby improving the flexibility of a display apparatus.

Also, in a method of manufacturing a display apparatus in an embodiment, a pattern layer may be disposed on a first base layer to separate the first base layer.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by those of ordinary skill in the art that various changes in form and details may be made therein without departing from the spirit and scope of the invention.

What is claimed is:

1. A display apparatus comprising:
a display panel in which a through-opening is defined, the display panel comprising:
   a first pixel area in which a first pixel is disposed;
   a second pixel area in which a second pixel is disposed; and
   a connection area extending from the first pixel area to the second pixel area,
wherein an edge of the first pixel area, an edge of the connection area, and an edge of the second pixel area define at least a part of the through-opening passing through the display panel, and
wherein a thickness of the display panel in the connection area is less than a thickness of the display panel in the first pixel area.

2. The display apparatus of claim 1, wherein the display panel further comprises:
a substrate; and
a display element disposed on the substrate and implementing the first pixel and the second pixel,
wherein a thickness of the substrate overlapping the connection area is less than a thickness of the substrate overlapping the first pixel area.

3. The display apparatus of claim 2, wherein the substrate comprises a first base layer, a first barrier layer, and a second base layer which are sequentially stacked,
wherein the first base layer and the second base layer overlap the first pixel area, and
the first base layer does not overlap the connection area.

4. The display apparatus of claim 3, wherein at least one of the first base layer and the second base layer comprises an inclined surface.

5. The display apparatus of claim 1, wherein the display panel further comprises:
a substrate;
an organic insulating layer disposed on the substrate; and
a display element disposed on the organic insulating layer and implementing the first pixel and the second pixel,
wherein the substrate overlaps the first pixel area and does not overlap the connection area, and
the organic insulating layer extends from the first pixel area to the connection area.

6. The display apparatus of claim 1, wherein the display panel further comprises a top surface of the display panel and a bottom surface of the display panel opposite to the top surface of the display panel,
wherein a plurality of grooves is defined in the bottom surface of the display panel in the connection area.

7. The display apparatus of claim 1, wherein a width of the first pixel area is greater than a width of the connection area.

8. The display apparatus of claim 1, wherein a plurality of concaves recessed toward an inner portion of the connection area is defined in an edge of the connection area.

9. The display apparatus of claim 1, wherein a plurality of through-holes is defined in the display panel in the connection area.

10. The display apparatus of claim 1, further comprising a pattern layer overlapping the connection area,
wherein the pattern layer comprises at least one of graphene oxide and polytetrafluoroethylene.

* * * * *